(12) United States Patent
Mi et al.

(10) Patent No.: US 11,979,675 B2
(45) Date of Patent: May 7, 2024

(54) IMAGE SENSING DEVICE WITH EVENT BASED VISION SENSOR PIXELS AND IMAGING PIXELS

(71) Applicant: Sony Semiconductor Solutions Corporation, Kanagawa (JP)

(72) Inventors: Hongyi Mi, Victor, NY (US); Frederick T. Brady, Webster, NY (US); Sungin Han, Pittsford, NY (US); Pooria Mostafalu, Penfield, NY (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 156 days.

(21) Appl. No.: 17/728,190

(22) Filed: Apr. 25, 2022

(65) Prior Publication Data

US 2023/0345147 A1    Oct. 26, 2023

(51) Int. Cl.
*H04N 25/702* (2023.01)
*H01L 27/146* (2006.01)
*H04N 25/75* (2023.01)
*H04N 25/79* (2023.01)

(52) U.S. Cl.
CPC ..... *H04N 25/702* (2023.01); *H01L 27/14621* (2013.01); *H01L 27/14627* (2013.01); *H01L 27/1463* (2013.01); *H01L 27/14634* (2013.01); *H01L 27/14636* (2013.01); *H01L 27/14645* (2013.01); *H04N 25/79* (2023.01); *H04N 25/75* (2023.01)

(58) Field of Classification Search
CPC ......... H01L 27/14621; H01L 27/14634; H01L 27/14645; H01L 27/14627; H01L 27/14636; H01L 27/1463; H04N 25/79; H04N 25/702; H04N 25/75

USPC .......................................................... 348/273
See application file for complete search history.

(56) References Cited

U.S. PATENT DOCUMENTS

| | | | | |
|---|---|---|---|---|
| 10,237,506 B2* | 3/2019 | Park | ...................... | H04N 23/45 |
| 11,195,869 B2* | 12/2021 | Mi | ..................... | H01L 27/14612 |
| 2012/0217602 A1* | 8/2012 | Enomoto | .......... | H01L 27/14654 |
| | | | | 257/E31.127 |
| 2013/0235243 A1* | 9/2013 | Sano | ...................... | H04N 25/76 |
| | | | | 348/308 |

(Continued)

FOREIGN PATENT DOCUMENTS

WO    2021256031 A1    12/2021

OTHER PUBLICATIONS

International Search Report dated Jun. 13, 2023 for corresponding International Application No. PCT/IB2023/052836.

*Primary Examiner* — Pritham D Prabhakher
(74) *Attorney, Agent, or Firm* — Michael Best & Friedrich LLP

(57) ABSTRACT

Image sensing devices are disclosed. In one example, an image sensing device includes a pixel unit cell with both event sensing (EVS) pixels and imaging pixels. The EVS and imaging pixels are configured to include event sensing and imaging pixel transistors formed in the same transistor layer of an integrated circuit assembly that also includes the photodiodes of the EVS and imaging pixels. The photodiodes are separated by a rear deep trench isolation (RDTI), and the EVS and imaging pixel transistors are arranged along (e.g., underneath) boundary areas formed by the RDTI, maximizing the space available for the photodiodes and economizing on wiring requirements for the EVS and imaging pixels.

11 Claims, 33 Drawing Sheets

(56) References Cited

U.S. PATENT DOCUMENTS

| | | | |
|---|---|---|---|
| 2014/0368712 A1* | 12/2014 | Park | H04N 23/45 |
| | | | 348/308 |
| 2014/0374865 A1* | 12/2014 | Kobayashi | H01L 31/02005 |
| | | | 257/435 |
| 2017/0059399 A1* | 3/2017 | Suh | H04N 25/77 |
| 2018/0091723 A1* | 3/2018 | Funaki | H04N 23/745 |
| 2019/0386052 A1* | 12/2019 | Furuhashi | H01L 27/088 |
| 2020/0027914 A1* | 1/2020 | Lee | H01L 27/14612 |
| 2020/0084403 A1* | 3/2020 | Suh | H04N 25/77 |
| 2021/0134865 A1* | 5/2021 | Shim | H01L 27/1463 |
| 2023/0030480 A1* | 2/2023 | Kim | G04F 10/005 |

* cited by examiner

RDTI cross-section

RDTI cross-section

IMAGE SENSING DEVICE WITH EVENT BASED VISION SENSOR PIXELS AND IMAGING PIXELS

BACKGROUND

Field

This application is generally related to image sensors, and more particularly to an image sensor that includes event based sensor (EVS) pixels and imaging pixels.

Description of the Related Art

Image sensors are used in various electronic imaging devices and systems, such as digital cameras, smartphones, medical imaging equipment, night vision equipment, vehicular equipment, etc. Two main types of image sensors used in such imaging devices are the charge-coupled-device (CCD) sensors and the active-pixel, complementary metal-oxide-semiconductor (CMOS) sensors.

CMOS image sensor devices may typically provide several processing and/or control functions directly in the sensor's integrated circuit (IC) and/or IC assembly. For example, functional circuits of some CMOS sensors may enable one or more of: timing and exposure control, analog-to-digital conversion, shuttering, white balance, gain adjustment, and initial signal and/or image processing. Proper integration of such functional circuits into the sensor is typically needed for optimal performance.

Some image sensing devices have associated event detection, in addition to receiving and processing images.

SUMMARY OF SOME SPECIFIC EMBODIMENTS

Disclosed herein are various embodiments of image sensing devices that simultaneously support event-based vision sensor (EVS) and image capture modes of operation.

In one example, an image sensing device includes a pixel unit cell with both event sensing (EVS) pixels and imaging pixels. The EVS and imaging pixels are configured to include event sensing and imaging pixel transistors formed in the same transistor layer of an integrated circuit assembly that also includes the photodiodes of the EVS and imaging pixels. The photodiodes are separated by a rear deep trench isolation (RDTI), and the EVS and imaging pixel transistors are arranged along (e.g., underneath) boundary areas formed by the RDTI, maximizing the space available for the photodiodes and economizing on wiring requirements for the EVS and imaging pixels. These various features individually and collectively accommodate lower transistor density and larger active photodiode areas.

In one example, an image sensing device comprises a pixel array including imaging pixels and event sensing pixels, the pixel array being a two-dimensional array, the imaging pixels and the event sensing pixels being interspersed in the pixel array. Imaging pixel circuitry is configured to provide image signals from the imaging pixels, and event sensing pixel circuitry is configured to provide an event signal from the event sensing pixels.

A trench isolation may be formed around each of the imaging pixels and the event sensing pixels in the pixel array. Additionally, a first transistor in the imaging pixel circuitry and a second transistor in the event sensing pixel circuitry can be respectively arranged below the trench isolation in a cross-section view.

The two-dimensional array extends in a horizontal direction and a vertical direction, and the trench isolation can form a first boundary region that extends in the horizontal direction, and a second boundary region that extends in the vertical direction. A first transistor in the imaging pixel circuitry and a second transistor in the event sensing pixel circuitry may then be respectively arranged below the first boundary region in a cross-section view. Alternatively, a first transistor in the imaging pixel circuitry may be arranged below the first boundary region in a cross-section view, and a second transistor in the event sensing pixel circuitry may be arranged below the second boundary region in the cross-section view.

The pixel array can be formed on a first integrated circuit, with a first transistor in the imaging pixel circuitry and a second transistor in the event sensing pixel circuitry respectively arranged in a same transistor layer of the first integrated circuit.

The image sensing device may also comprise a stacked assembly including a first part bonded to a second part, with the first part including the first integrated circuit and the second part including a second integrated circuit. There, a third transistor in the event sensing pixel circuitry can be arranged in the second integrated circuit, and a fourth transistor in the image sensing pixel circuitry can be arranged in the second integrated circuit.

The event sensing pixels respectively include photodiodes, and the photodiodes are connected in parallel to the event sensing pixel circuitry to provide the event signal. The image sensing pixels also respectively include photodiodes, and corresponding different color filters may be arranged for individual ones of the image sensing pixels.

The event signal for the event sensing pixels can be connected for readout without switch gate control. At the same time, the image signals can be sequentially readout from respective ones of the imaging pixels using transfer transistors, simultaneous with the event signal readout.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Figure 1:
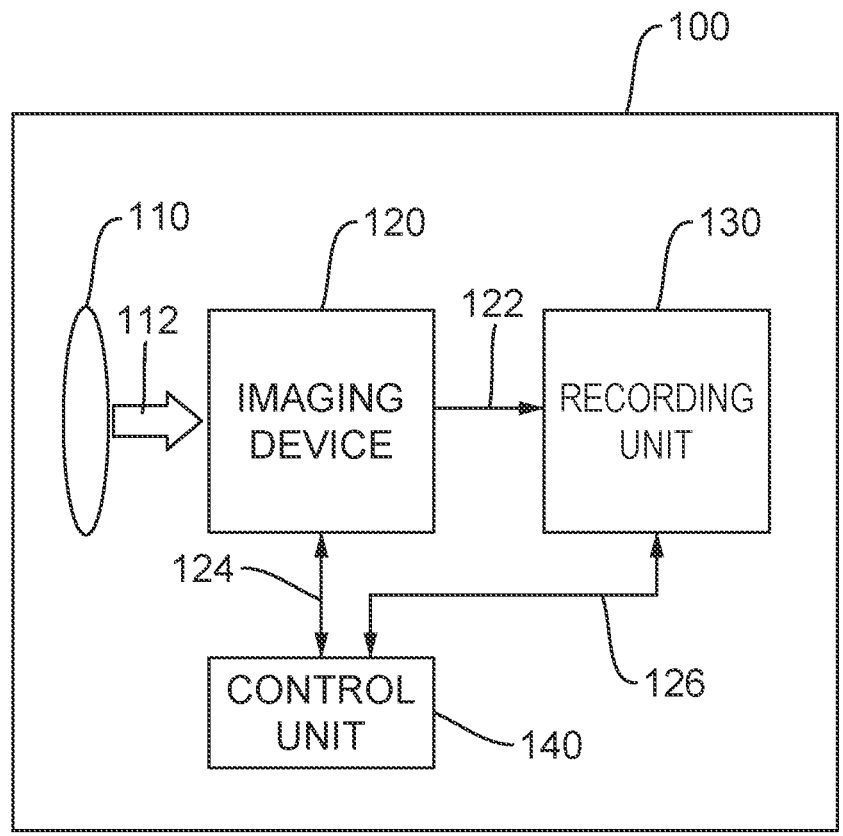
FIG. 1 is a block diagram illustrating an imaging system.

FIG. 1 is a block diagram illustrating an imaging system 100. The system 100 can be used, e.g., in a camera of an industrial robot or autonomous vehicle. Other uses of the system 100 may also be contemplated.

As shown, system 100 comprises an imaging lens 110, an electronic imaging device 120, a recording unit 130, and a control unit 140. In operation, lens 110 directs incident light 112 to form an image of the corresponding object or scene on a light-receiving surface of imaging device 120. Such light-receiving surface typically comprises a two-dimensional array of photodetectors (not explicitly shown in FIG. 1; e.g., see FIG. 7) configured to perform optical-to-electrical conversion to generate electrical signals representing the image. In an example embodiment, imaging device 120 may also operate to apply some signal processing to the electrical signals prior to outputting the corresponding digital signals 122 to recording unit 130, e.g., for storage in a memory thereof. Such memory may comprise, e.g., a solid-state memory device or other suitable forms of memory. Control unit 140 may use control signals 124, 126 to control and coordinate various operations and/or functions performed by imaging device 120 and recording unit 130.

Figure 2:
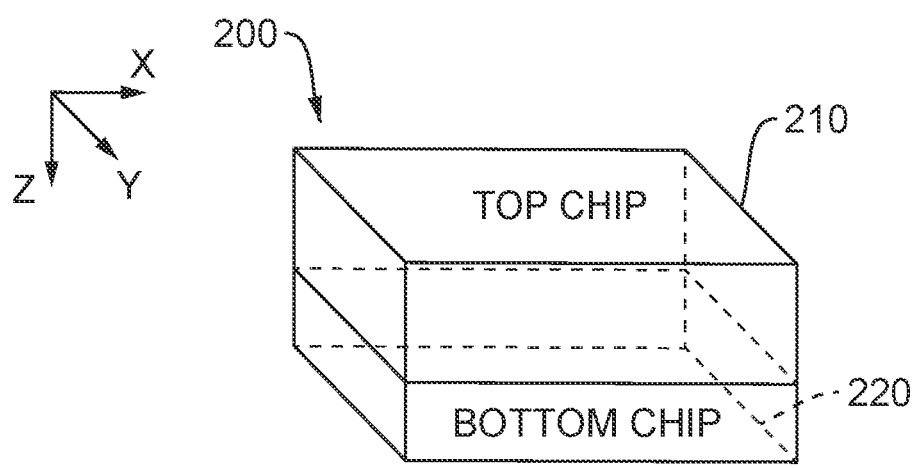
FIG. 2 is a perspective diagram illustrating an IC assembly for an imaging system.

FIG. 2 is a perspective diagram illustrating an IC assembly 200 for an imaging system. The IC assembly 200 comprises a top chip 210 and a bottom chip 220 arranged in a vertical stack. In some examples, the top chip 210 may generally be a light-receiving chip, and the bottom chip 220 may generally be a logic chip. The circuitry of imaging and EVS pixels may be variously shared within the same chip, or may be arranged so as to be partially located on one chip, and partially located on another chip, depending upon the embodiment as will be understood in at least the following examples.

As used herein, the term "stack" refers to an orderly arrangement of packaged or non-packaged dies in which main planes of the stacked dies face and are near each other. The facing dies or chips may be electrically connected, e.g., using patterned conducting (such as metal) layers, ball-grid arrays, solder bumps, wire bonds, etc. In some such embodiments, the dies or chips of a stack can be mounted on a mechanical carrier in an orientation in which the main planes of the stacked dies are parallel to each other and/or to the main plane of the mechanical carrier. In some such embodiments, one of the dies or chips of the stack may function as the mechanical carrier. In some embodiments, individual ICs of the stack may include any combination of one or more respective substrates, one or more redistribution layers (RDLs), one or more interposers, one or more laminate plates, etc.

Herein, a "main plane" of an object, such as a die, a substrate, or an IC, is a plane parallel to a substantially planar surface thereof that has about the largest area among exterior surfaces of the object. This substantially planar surface may be referred to as a main surface. The exterior surfaces of the object that have one relatively large size, e.g., length, but are of much smaller area, e.g., less than one half of the main-surface area, are typically referred to as the edges of the object.

Herein, the term "vertical" refers to a direction that is approximately orthogonal to a main plane of the top chip 210 or the bottom chip 220. In FIG. 2, a vertical direction is parallel to the Z-coordinate axis. The term "horizontal" refers to a direction that is approximately parallel to said main plane. In FIG. 2, a horizontal plane is parallel to the XY-coordinate plane.

In some embodiments, chips 210 and 220 may be flip-chip bonded using direct joining, in which the facing surfaces of the chips are planarized, and the chips are laminated together to form assembly 200. In some other embodiments, chips 210 and 220 may be flip-chip bonded using Cu-to-Cu joining, in which copper (Cu) pads formed on the facing surfaces of the chips are bonded to provide electrical connections between the chips in assembly 200. In some alternative embodiments, other suitable chip-stacking techniques may also be used.

Figure 3:
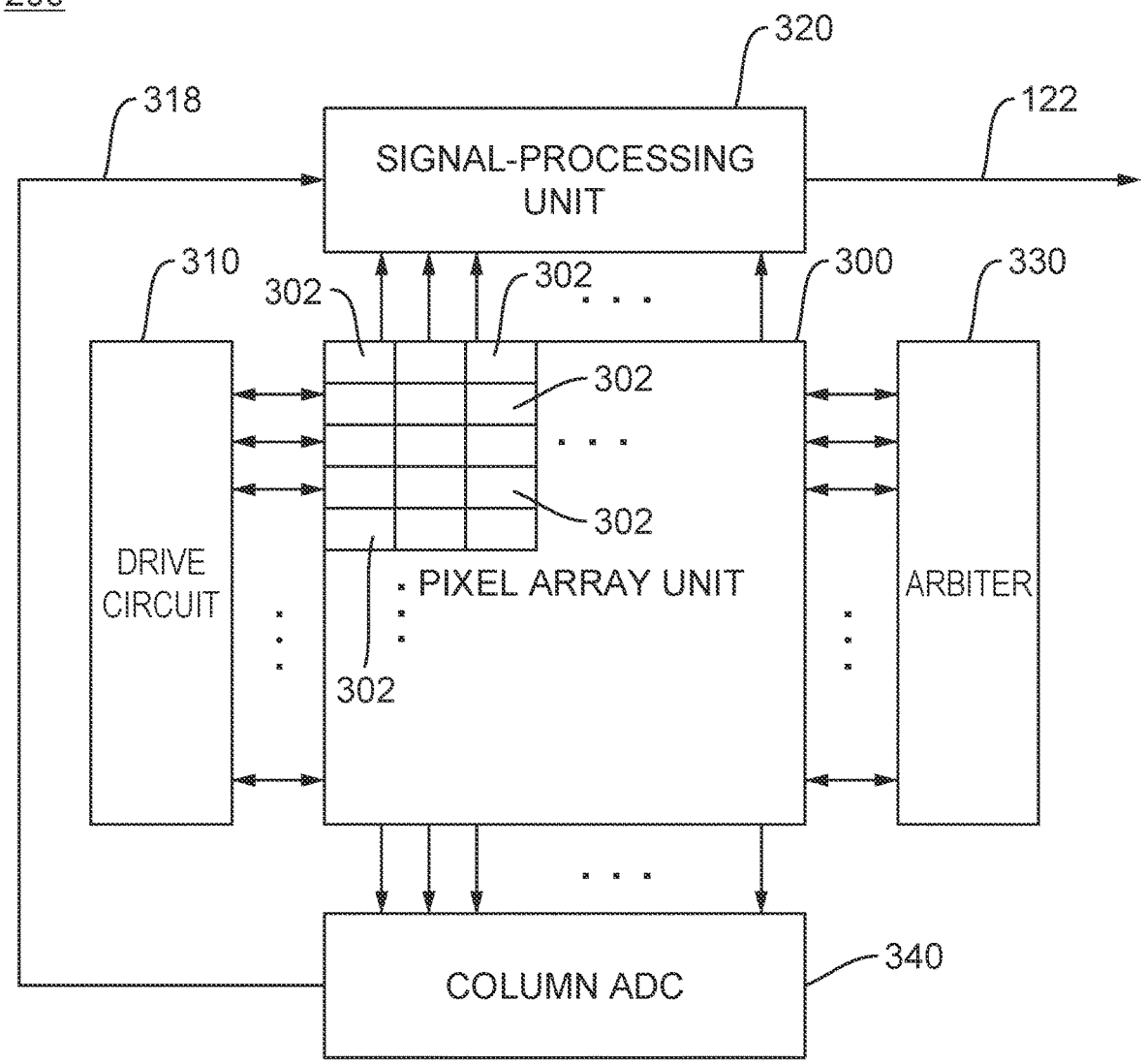
FIG. 3 is a circuit block diagram of an IC assembly.

FIG. 3 is a circuit block diagram of an IC assembly. The IC assembly 200 comprises a pixel array unit 300, a drive circuit 310, a signal-processing unit 320, an arbiter 330, and a column analog-to-digital converter (ADC) circuit 340. In an example embodiment, the top chip 210 (FIG. 2) may typically include pixel array unit 300, whereas bottom chip 220 may typically include drive circuit 310 and arbiter 330. In alternative embodiments, such as those described further herein, other suitable partitions of circuits 310, 320, 330, and 340 between chips 210 and 220 may also be implemented.

Pixel array unit 300 comprises a plurality of pixels 302 arranged in a two-dimensional matrix array, wherein individual pixels 302 are arranged in mutually orthogonal rows and columns. The matrix array of pixels 302 occupies at least a portion of the above-mentioned light-receiving surface of imaging device 120. Each of pixels 302 may typically include two or more subpixels, e.g., as described in more detail below in reference to FIGS. 4A-4B. Some of the different subpixels of a same individual pixel unit cell 302 may differ, e.g., in the respective sensitivities to different colors of light, the manners in which they are connected or not connected to arbiter 330, the manners in which they are driven by drive circuit 310, and/or the manners in which they are accessed by external circuits. In an example embodiment, pixel array unit 300 may have a size in which pixels 302 are arranged in 1280 columns and 720 rows. In other embodiments, other array sizes may also be used.

In operation, subpixels of pixels 302 may generate electrical charges in response to received light. Drive circuit 320 may apply drive signals (e.g., voltages) to pixels 302 and sub-pixels thereof to enable pixels/subpixels to accumulate the charges and then output corresponding electrical signals to column ADC circuit 340. Arbiter 330 may be used for the EVS mode, where the acronym EVS stands for "event-based vision sensor." More specifically, arbiter 330 may operate to arbitrate requests from different pixels 302 to cause event-triggered readout therefrom to be performed in the order of occurrence of the corresponding events. Column ADC circuit 340 may operate to convert the received analog electrical signals into digital form and direct resulting digital signals 318 to signal-processing unit 320. Signal-processing unit 320 may operate to execute appropriate signal processing, such as correlated double sampling (CDS) processing, white balance adjustment, etc. Resulting processed signals 122 and addresses of event-triggered pixels may then be provided to recording unit 130 (also see FIG. 1).

Some embodiments disclosed herein may benefit from at least some EVS features disclosed, e.g., in U.S. Pat. No. 11,195,869, which is incorporated herein by reference in its entirety.

Figure 4A:
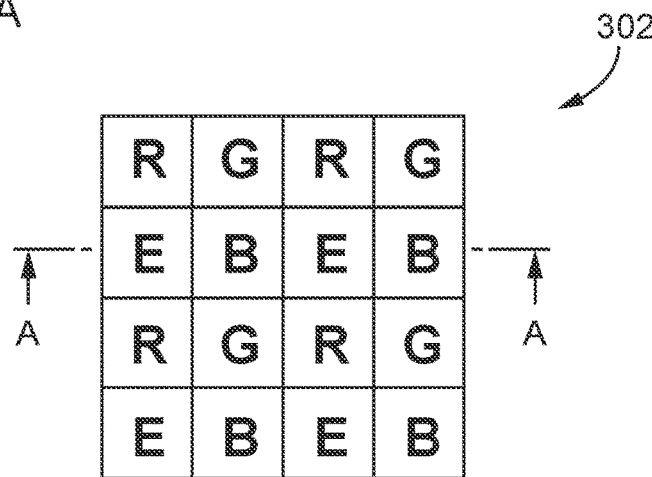
FIGS. 4A-4B are schematic and cross-sectional diagrams illustrating examples of EVS and imaging pixels.
Figure 4B:
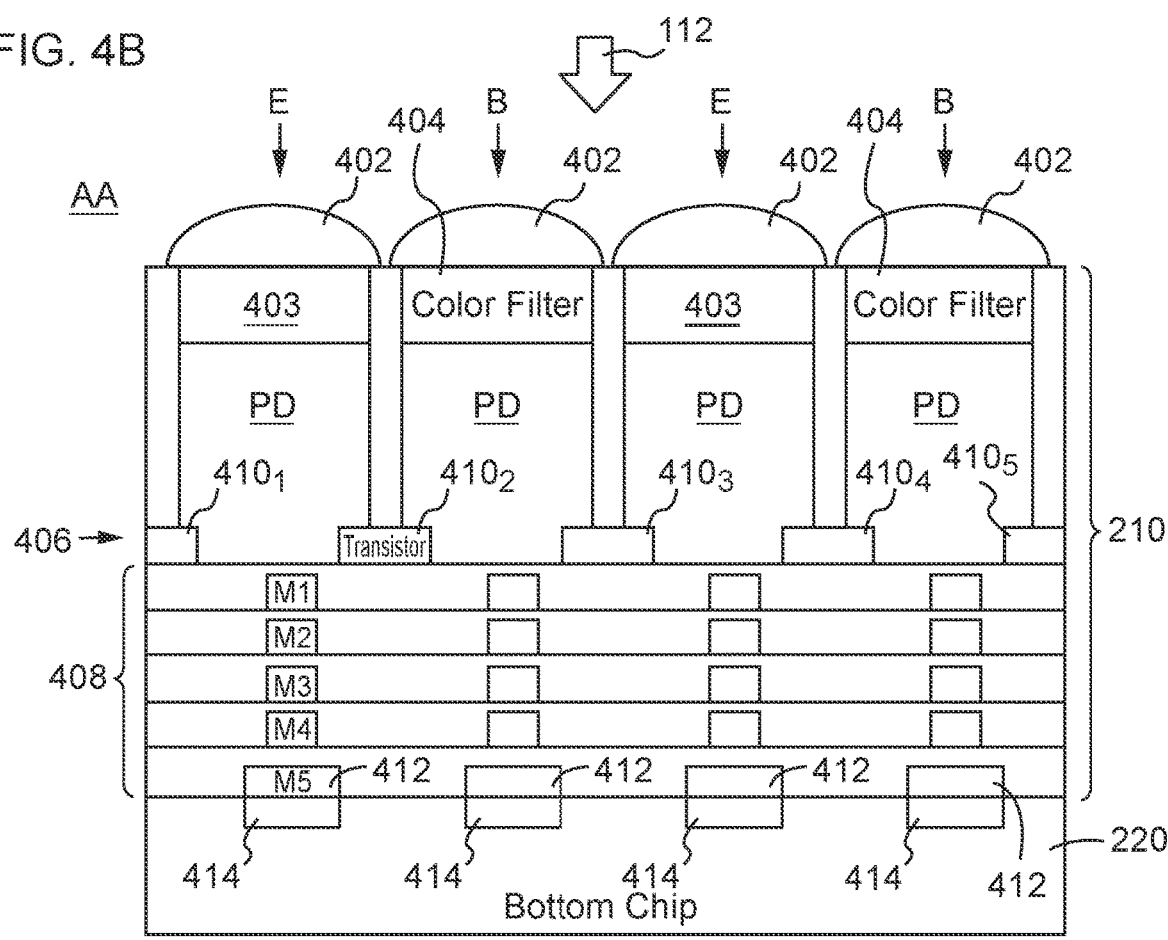

FIGS. 4A-4B are schematic and cross-sectional diagrams illustrating examples of EVS and imaging pixels. More specifically, FIG. 4A shows a schematic plan view of a pixel unit cell 302. FIG. 4B shows a cross-sectional side view of assembly 200 corresponding to a vertical cross-section plane AA marked in FIG. 4A.

Referring to FIG. 4A, the pixel unit cell 302 comprises sixteen subpixels arranged in a 4×4 two-dimensional matrix array, i.e., in four rows and four columns. The subpixels include: (i) four EVS subpixels, labeled E; and (ii) twelve imaging subpixels, labeled R, G, B. Differently labeled imaging subpixels have different color filters, e.g., in accordance with the conventional RGB color scheme. In alternative embodiments, other color schemes (e.g., CMY, etc.) known to persons of ordinary skill in the pertinent art may also be used. The subpixels may also be referred to as pixels, e.g., EVS pixels and imaging pixels.

The sixteen subpixels E (short for EVS), R, G, B of pixel unit cell 302 are arranged in four groups of four subpixels each. Each of the groups has exactly one of each of the E, R, G, and B subpixels arranged in a 2×2 array and is located in the respective one of the four quadrants of pixel unit cell 302. In the shown embodiment, each of the groups has an identical arrangement and orientation of the subpixels, e.g., can be viewed as having a respective copy of the same 2×2 ERGB subpixel array. In an alternative embodiment, some of the groups may differ from one another, e.g., in the relative order and/or position of the E, R, G, B subpixels therein. In some alternative embodiments, pixel unit cell 302 may include a different number of subpixels and/or groups of subpixels.

Referring to FIG. 4B, each of the subpixels of pixel unit cell 302 may have a respective optional lens 402 disposed adjacent and along a main surface of light-receiving chip 210. Rear deep trench isolation (RDTI) is used at subpixel borders, as indicated in FIG. 4B, to physically separate and laterally surround the photodiodes (PDs) of adjacent subpixels. Red, green, and blue color filters 404 may be located between a top surface of the corresponding PD and a bottom surface of the corresponding lens 402 in the R, G, and B subpixels, respectively. In the shown cross-section, only the blue filters 404 are visible. Corresponding spaces 403 in the E subpixels may not have any color filters therein and may be filled by a suitable optically transparent, colorless filler material, e.g., silicon oxide.

On-chip transistors $410_i$ (where i=1, 2, ..., 5, ...) of the top chip 210 are located in a device layer 406 of the chip, typically near the buried edges of the RDTI structures thereof. The E pixels and imaging (color) pixels respectively have pixel circuitry for signal generation and readout as described further below. At least some of the transistors in this pixel circuitry may be formed in a shared fashion, within the same layer 406 for both the EVS pixels and the imaging pixels. Additionally, these transistors may be formed under the RDTI boundary regions, thus accommodating larger active PD areas.

A metal interconnect structure 408 of light-receiving chip 210 is used to electrically connect the PDs and transistors $410_i$ and also to route electrical connections between various circuit elements of top chip 210 and bottom chip 220.

For illustration purposes and without any implied limitations, metal interconnect structure 408 is shown in FIG. 4B as having five vertically offset metal levels, labeled M1-M5. In an alternative embodiment, a different (from five) number of such vertically offset metal levels may similarly be used in light-receiving chip 210. Spaces between different electrical conductors of the metal levels M1-M5 are typically filled with inter-level dielectric (ILD), e.g., as known in the pertinent art. ILD layers may have metal-filled vias therein to provide intended electrical connections between selected conductors of different metal levels of metal interconnect structure 408.

The M5 level of metal interconnect structure 408 is illustratively shown as having a plurality of metal pads 412 mated with a corresponding plurality of metal pads 414 of bottom (e.g., logic) chip 220 to provide electrical connections between the chips.

Figure 5:
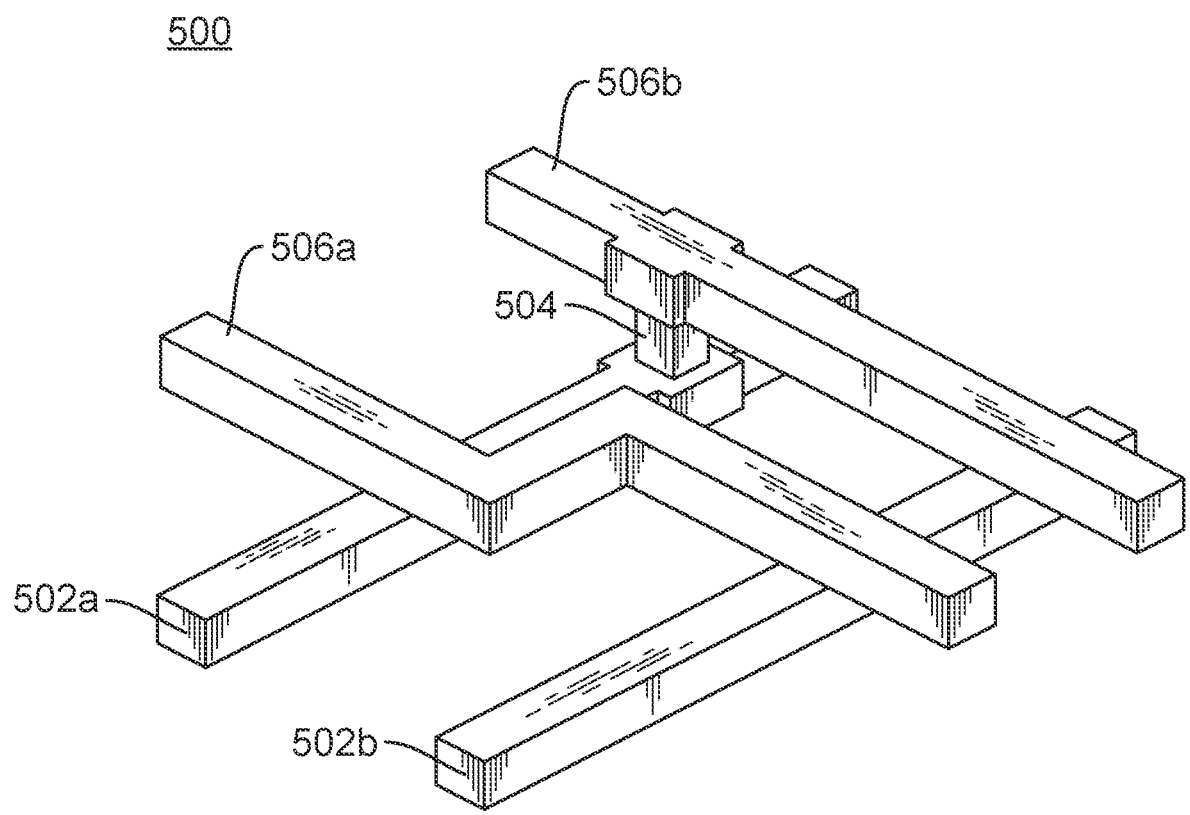
FIG. 5 is a perspective diagram illustrating a portion of a metal interconnect structure of the IC assembly.

FIG. 5 shows a perspective three-dimensional cutout view of a portion 500 of interconnect structure 408 according to an embodiment. Portion 500 includes conductors 502a and 502b of metal level Mn and conductors 506a and 506b of metal level M(n+1), where n can be 1, 2, 3, or 4. The corresponding ILD layers are not explicitly shown in FIG. 5 for better clarity of depiction.

As shown, conductors 504a,b and 506a,b are substantially planar, horizontal metal tracks. In general, some of such metal tracks of interconnect structure 408 may have L-shaped turns, e.g., similar to that of conductor 506a. Some of the metal tracks, such as that of the Mn-level conductor 502a and that of the M(n+1)-level conductor 506b, may be directly electrically connected to one another using one or more metal-filled, vertical vias, such as a via 504. Some of such metal-filled, vertical vias (not explicitly shown in FIG. 5) may span more than two metal levels of interconnect structure 408 and be implemented as a stack of vias corresponding to individual levels of the structure.

Figure 6A:
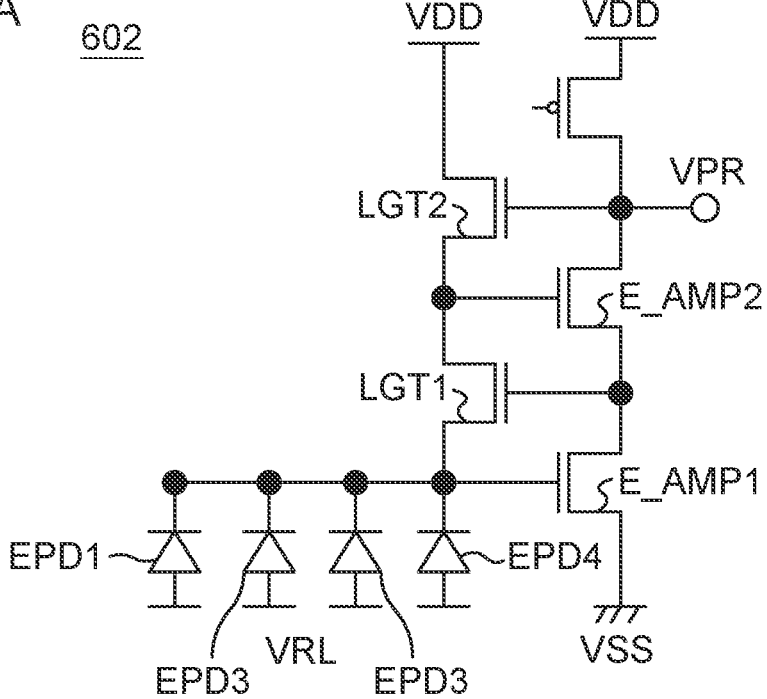
FIGS. 6A-6B are circuit diagrams illustrating examples of EVS pixel circuitry and imaging pixel circuitry.
Figure 6B:
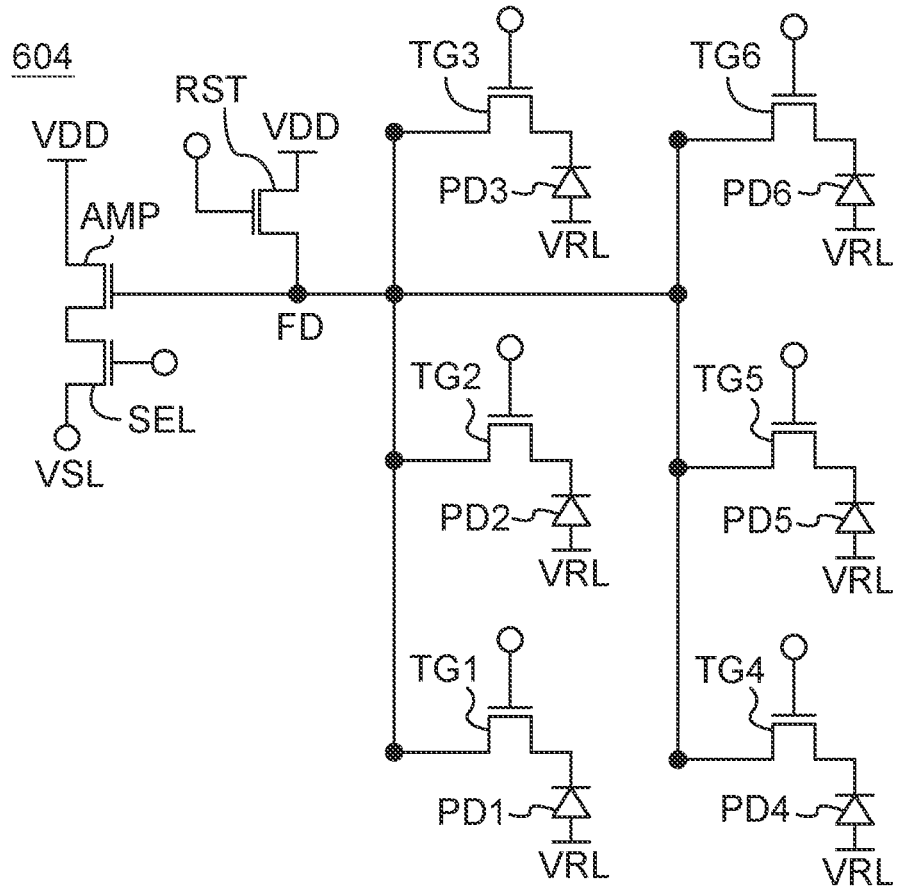

FIGS. 6A-6B are circuit diagrams illustrating examples of EVS pixel circuitry and imaging pixel circuitry. In one example, this circuitry is implemented in top (light-receiving) chip 210. More specifically, FIG. 6A illustrates a circuit 602 corresponding to the E subpixels of pixel unit cell 302. The circuit 602 may be referred to as EVS pixel circuitry, and is configured to accommodate event detection using the EVS pixels. FIG. 6B illustrates a circuit 604 corresponding to a subset of the R, G, B subpixels of pixel unit cell 302.

In an example embodiment, pixel unit cell 302 may include one instance of circuit 602 and two instances of circuit 604. Various transistors of such circuits 602 and 604 may be implemented using device layer 406 of top (e.g., light-receiving) chip 210. At least some electrical connections between various circuit elements of circuit 602 and between various circuit elements of circuit 604 may be implemented using interconnect structure 408 of light-receiving chip 210 (also see FIGS. 4B and 5).

Referring to FIG. 6A, photodiodes EPD1, EPD2, EPD3, and EPD4 of circuit 602 are the photodiodes of the E subpixels of pixel unit cell 302 (also see FIGS. 4A-4B). Log transistors LGT1 and LGT2 and amplifier transistors E_AMP1 and E_AMP2 of circuit 602 are configured to form a logarithmic current-to-voltage conversion circuit for processing the photocurrents generated by photodiodes EPD1-EPD4. The voltage generated by this current-to-voltage conversion circuit appears at a terminal VPR. Terminals VDD, VSS, and VRL are connected to receive fixed supply voltages. The voltage applied to the VRL terminals may be selected such that photodiodes EPD1, EPD2, EPD3, and EPD4 are appropriately (e.g., negatively) biased to perform more-efficient charge separation. The transistor at the upper right-hand corner of the circuitry in FIG. 6A (and others) may also be included. It is a current control a current control transistor configured to behave like a current source, to help set a base current going through E_AMP2 and E_AMP1).

Referring to FIG. 6B, photodiodes PD1, PD2, PD3, PD4, PD5, and PD6 of circuit 604 are the photodiodes of six R, G, B subpixels of pixel unit cell 302, which include two R subpixels, two G subpixels, and two B subpixels. Amplifier transistor AMP, select transistor SEL, and reset transistor RST are shared by photodiodes PD1-PD6. Transfer transistors TG1-TG6 are connected between individual ones of the photodiodes PD1-PD6 and the gate of transistor AMP. A terminal VSL is a signal-readout terminal. Terminals VDD and VRL of circuit 604 may be connected to receive the same fixed supply voltages as the correspondingly labeled terminals of circuit 602.

Figure 7:
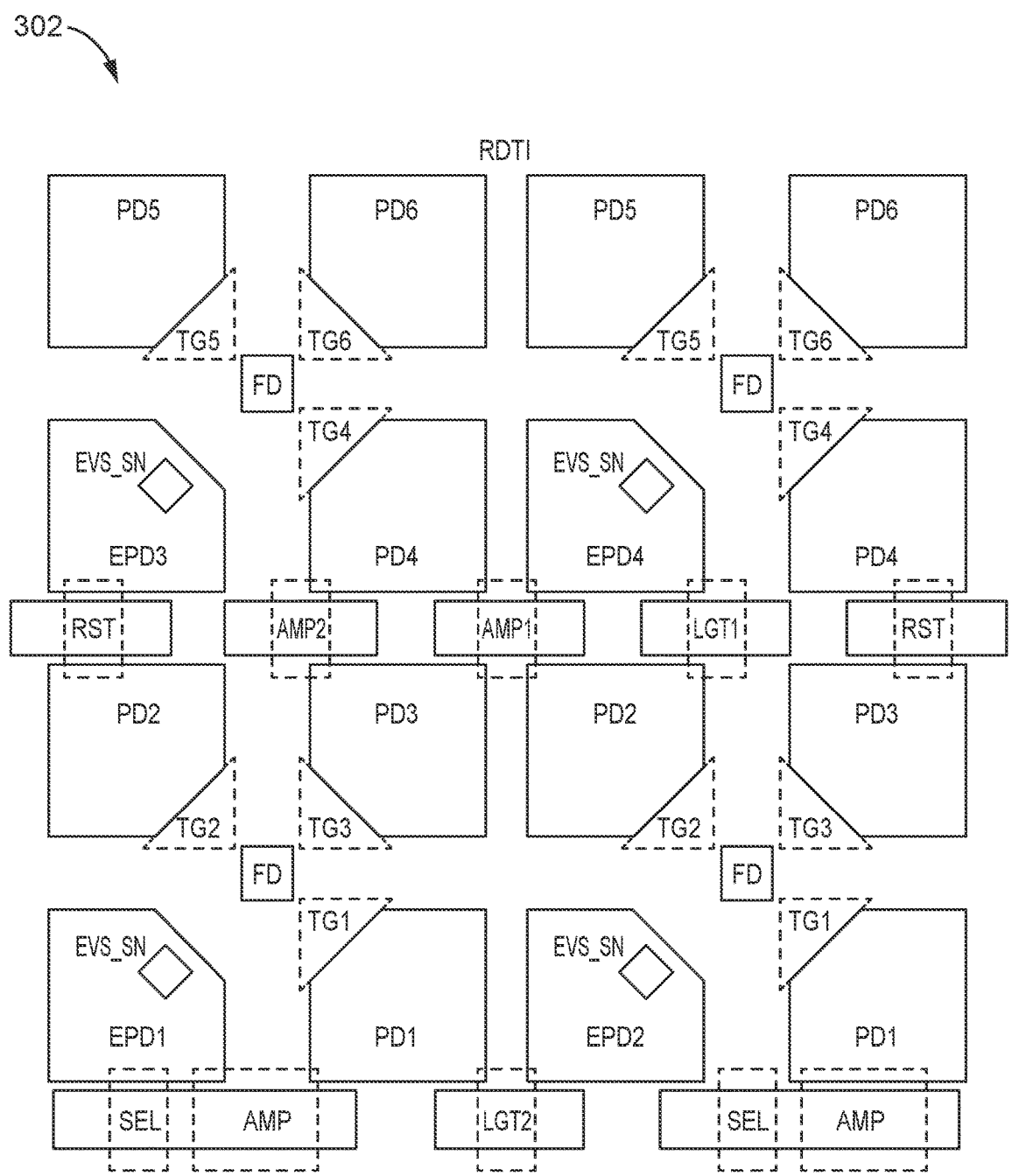
FIG. 7 is a layout diagram illustrating an example of a layout including EVS pixels and imaging pixels.

FIG. 7 is a layout diagram illustrating an example of a pixel unit cell layout 302 including EVS pixels and imaging pixels. More specifically, FIG. 7 shows a plan view of pixel unit cell 302, which corresponds to the plan view shown in FIG. 4A. The labeling of different circuit elements in FIG. 7 is the same as in FIGS. 6A-6B. As already indicated above, an individual pixel unit cell 302 has one instance of circuit 602 (FIG. 6A) and two instances of circuit 604 (FIG. 6B). The labels FD in FIGS. 6B and 7 denote a floating diffusion region. The labels EVS_SN in FIG. 7 denote the nodes of photodiodes EPD1-EPD4, which are used for electrically connecting the photodiodes to metal conductors of interconnect structure 408. The label RDTI denotes an RDTI structure of pixel unit cell 302, which is used to physically separate different photodiodes of the pixel from each other (also see FIG. 4B).

One pixel unit cell is illustrated in the layout 302 of FIG. 7. The pixel unit cell includes two pairs of imaging pixel sets corresponding to photodiodes PD1-6 (12 total). There are also four EVS pixels EPD1-4 included in the pixel unit cell.

The RST, AMP and SEL are imaging pixel circuitry transistors shared by the imaging PDs (2×3 share in this example) in the pixel unit cell. LGT1, LGT2, E_AMP1 and E_AMP2 are EVS pixel circuitry transistors that form the logarithmic circuit for output and are shared by all the EVS PDs (4 in this example of the pixel unit cell. The EVS PDs are localized dispersedly, and the EVS transistors are arranged along the middle (LGT1, E_AMP1/E_AMP2) and bottom (LGT2) boundaries. As indicated in the plan view of FIG. 7, the transistors are within a shared layer (dotted lines) below the PD and RDTI. In a cross-section view such as illustrated in FIG. 4B, the transistors are proximate to and arranged below relevant portions of the RDTI. The P well of PD may be formed as a shallow doping region and may be negatively biased as VRL. The value can be as low as −1.2V based on device operation requirement. The layout 302 of this example offers relatively higher EVS sensitivity and a larger PD area. However, there may be a relatively larger EVS metal wiring impact area due to the dispersed locations of the EVS PDs.

Manufacturing of top chip 210 having the pixel unit cell corresponding to the layout 302 of FIG. 7 may typically be implemented using two distinct processing stages, which are usually referred to as front-end-of-line (FEOL) processing and back-end-of-line (BEOL) processing.

During the FEOL processing, individual circuit devices, such as transistors, capacitors, resistors, etc., may be patterned and formed using the device layer (see, e.g., layer 406, FIG. 6A) of the corresponding wafer and any needed additional semiconductor layers adjacent thereto. In the context of CMOS processes, FEOL processing typically encompasses fabrication steps directed at forming photodiodes and/or isolated electrical CMOS elements. Such fabrication steps may include but are not limited to: (a) chemical-mechanical planarization (CMP) and cleaning of the wafer; (b) patterning the device layer; (c) trench isolation, e.g., RSTI; (d) well formation; (e) gate formation; (f) source and drain module formation, etc.

During the BEOL processing, the individual circuit devices formed during the FEOL processing may be electrically interconnected by forming an appropriate metal interconnect structure, e.g., 408, FIG. 4B. For example, contact pads, interconnect wires, vias, and various ILD layers may be formed. Example BEOL fabrication steps may include but are not limited to: (g) silicidation of source, drain, and poly-silicon regions; (h) forming and patterning various dielectric layers, some of which may be used as optical cladding; (i) forming and patterning various metal layers, e.g., to produce metal levels M1-M5, FIG. 4B; (j) making vias, e.g., 504, FIG. 5; (k) forming passivation layers, etc.

After the BEOL processing, the wafer may be subjected to post-fabrication processing. Such processing may include but is not limited to wafer testing, wafer-back grinding, dicing, die testing, and chip packaging. In contrast to the FEOL and BEOL processing, at least some of the steps of the post-fabrication processing may be performed outside the clean-room environment.

Circuits 602 and 604 may typically be operated using different operating modes of imaging device 120. For example, as already mentioned above, circuits 602 may be used in an EVS operating mode, in which the E subpixels of different pixels 302 may be continuously in the ON state, and arbiter 330 may arbitrate event-triggered requests from different pixels 302 for signal readout from the E subpixels thereof. In contrast, circuits 604 may be used for image-frame capture, wherein the R, G, and B subpixels of different pixels 302 may operate under control of the frame-capture circuitry of imaging device 120. Thus, in some situations, circuits 602 and 604 of the same pixel unit cell 302 may be active at the same time. In such situations, signals generated in circuits 602 and 604 may interfere and interact with each other, e.g., by way of electromagnetic crosstalk phenomena, thereby possibly causing the quality of images generated in both EVS and image-frame-capture modes to be detrimentally affected.

For example, a significant inter-mode interference reduction in imaging device 120 may be achieved by using a metal interconnect structure 408 of light-receiving chip 210 specifically designed to reduce the above-mentioned crosstalk, by optimizing (e.g., minimizing) the spatial overlap, within pixel unit cell 302, between the metal wirings corresponding to circuits 602 and 604.

Figure 8:
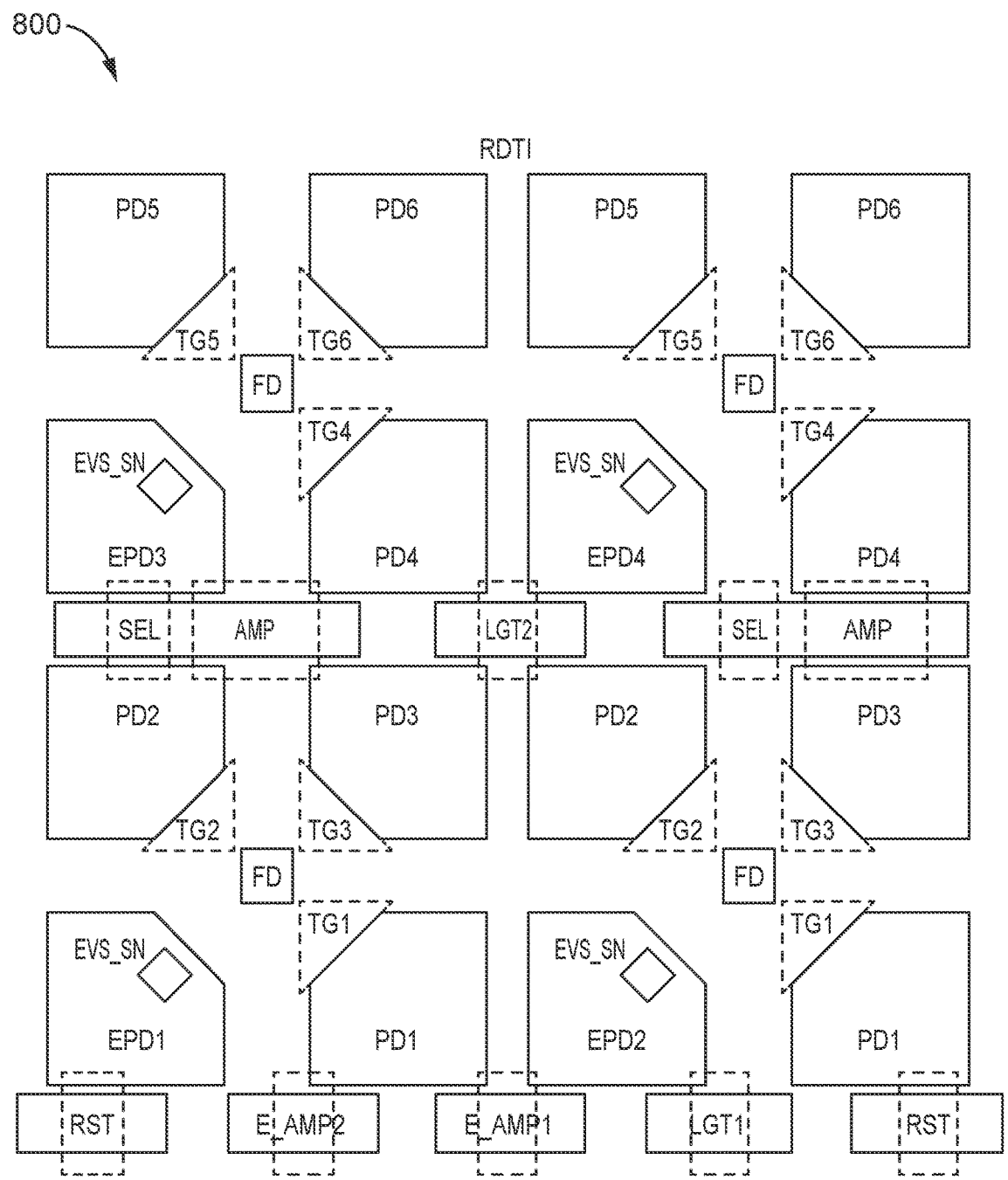
FIG. 8 is a layout diagram illustrating another example of a layout including EVS pixels and imaging pixels.

FIG. 8 is a layout diagram illustrating another example of a pixel unit cell layout 800 including EVS pixels and imaging pixels. This pixel unit cell layout 800 also uses the EVS and imaging pixel circuitry (e.g., FIGS. 6A-B, 602, 604) which is again preferably top chip (e.g., FIG. 2, 210) located. In this example, transistors RST, E_AMP1, E_AMP2 and LGT1 are located along the bottom boundary region (i.e., under the relevant portion of the RDTI as also illustrated in the cross-section of FIG. 4B). Also, transistors SEL, AMP and LGT2 are located along the middle boundary region (similarly, under the relevant portion of the RDTI boundary in cross-section). This arrangement retains relatively larger PD areas by locating these transistors under the RDTI.

Figure 9:
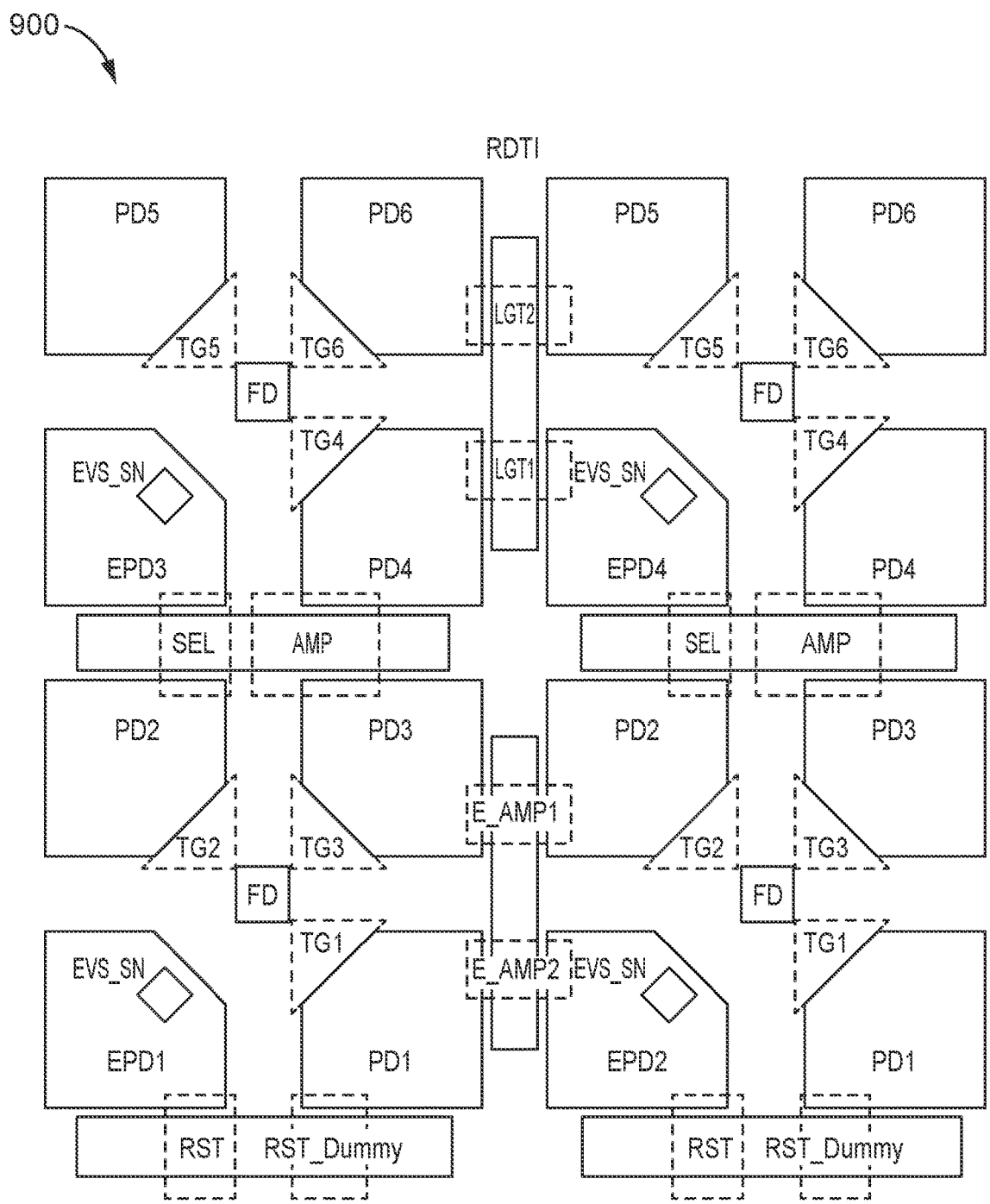
FIG. 9 is a layout diagram illustrating another example of a layout including EVS pixels and imaging pixels.

FIG. 9 is a layout diagram illustrating another example of a pixel unit cell layout 900 including EVS pixels and imaging pixels This pixel unit cell layout 900 also uses the EVS and imaging pixel circuitry (e.g., FIGS. 6A-B, 602, 604) which is again preferably top chip (e.g., FIG. 2, 210) located. Here, the EVS transistors LGT1, LGT2, E_AMP1 and E_AMP2 are arranged along a middle vertical boundary region. The SEL and AMP transistors are arranged along the middle horizontal boundary region and the RST transistors are arranged along the bottom horizontal boundary region. RST_Dummy transistors may also be arranged along the bottom boundary region. This arrangement simplifies the BEOL metal wiring process. However, the PD area may be slightly smaller than that of FIGS. 7-8.

Figure 10:
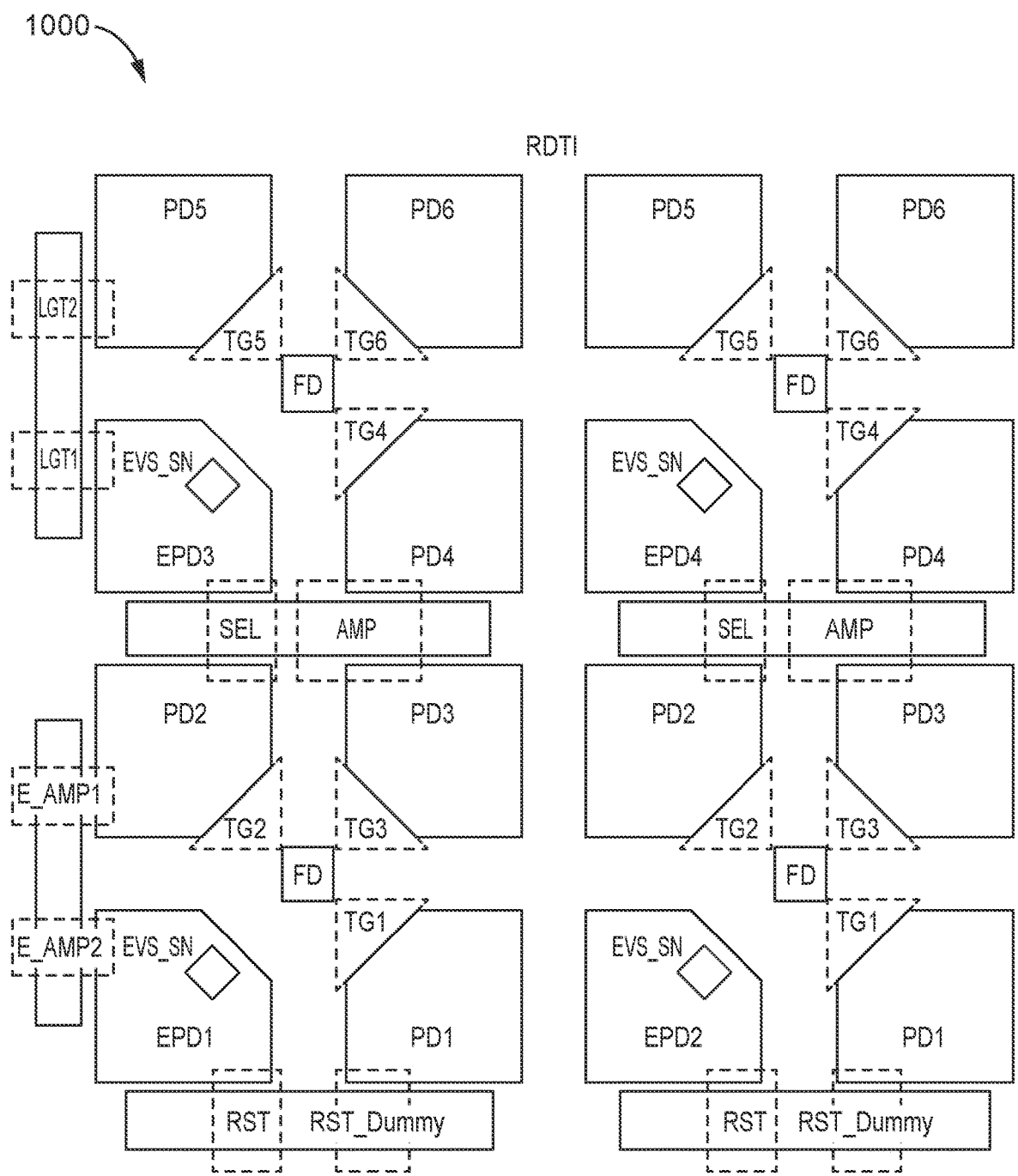
FIG. 10 is a layout diagram illustrating another example of a layout including EVS pixels and imaging pixels.

FIG. 10 is a layout diagram illustrating another example of a pixel unit cell layout 1000 including EVS pixels and imaging pixels. The pixel unit cell layout 1000 is similar to that of FIG. 9, but with the EVS transistors LGT1, LGT2, E_AMP1 and E_AMP2 arranged along a middle vertical boundary region.

Figure 11:
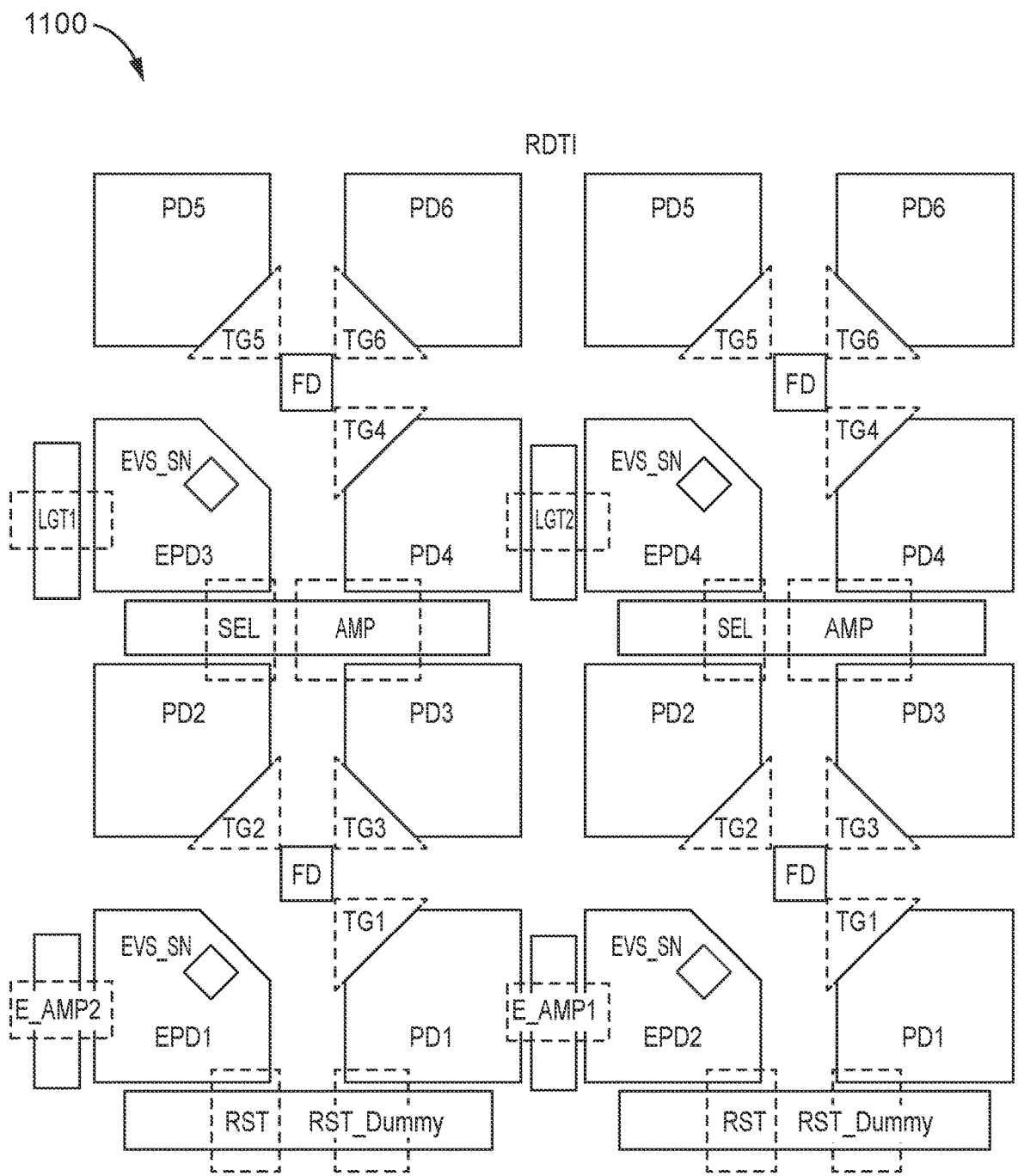
FIG. 11 is a layout diagram illustrating another example of a layout including EVS pixels and imaging pixels.

FIG. 11 is a layout diagram illustrating another example of a pixel unit cell layout 1100 including EVS pixels and imaging pixels. This pixel unit cell layout 1100 is similar to that of FIGS. 8-9, but with the EVS transistors dispersedly arranged along the middle and left vertical boundary regions. Specifically, the transistors LGT1 and E_AMP2 are arranged along the left vertical boundary region, and the transistors LGT2 and E_AMP1 are arranged along the middle vertical boundary region. This provides a more uniform EVS pixel transistor distribution.

Figure 12:
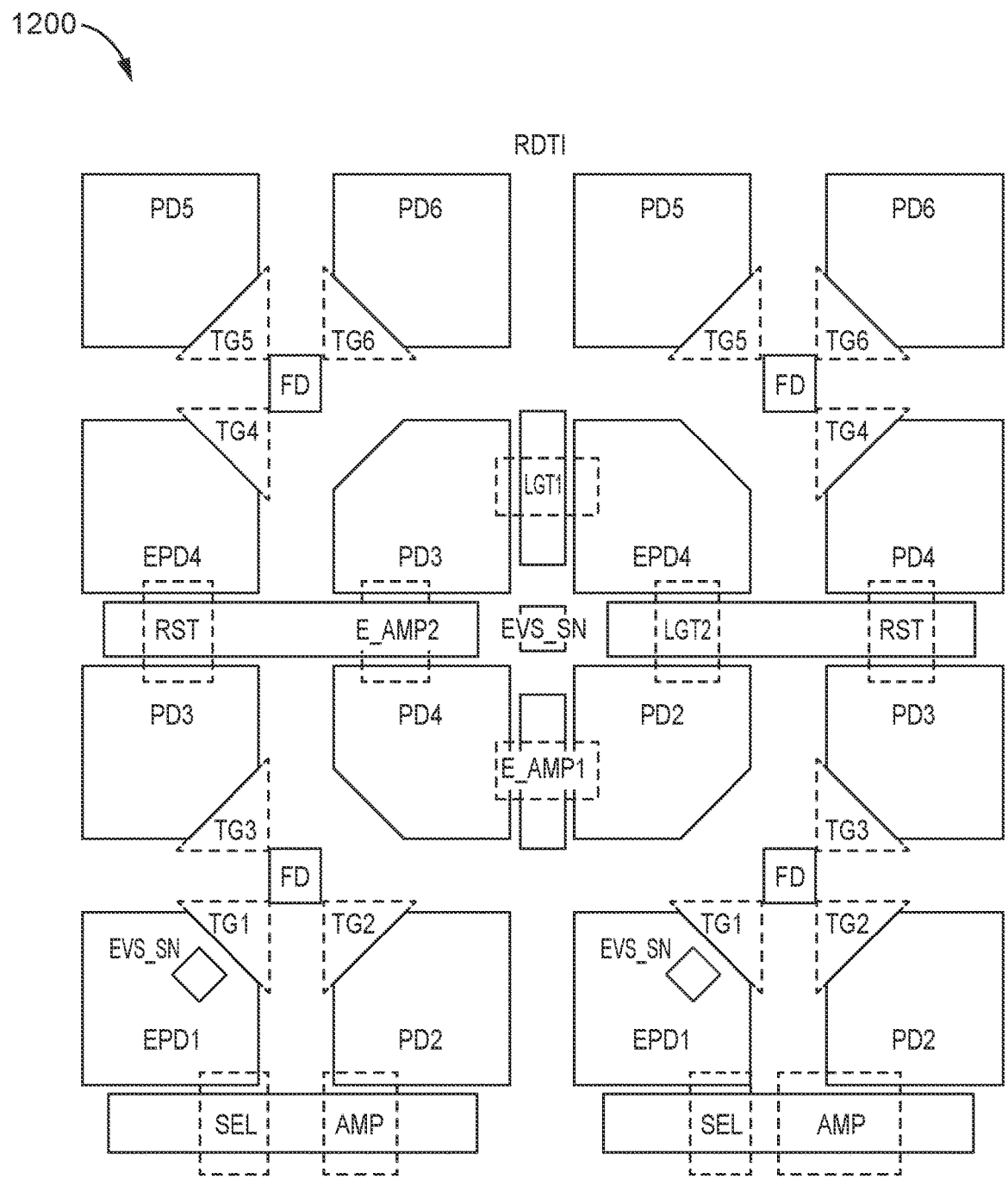
FIG. 12 is a layout diagram illustrating another example of a layout including EVS pixels and imaging pixels.

FIG. 12 is a layout diagram illustrating another example of a pixel unit cell layout 1200 including EVS pixels and imaging pixels. In this example, the EVS PDs EPD1-4 are arranged together at a middle portion of the pixel unit cell layout 1200. That is, each of the EVS PDs are arranged adjacent to both the horizontal boundary region and the vertical boundary region. Additionally, the EVS pixel transistors are arranged adjacent to the EVS PDs. Specifically, the EVS transistors LGT1 and E_AMP1 are arranged along the vertical middle boundary region and the EVS transistors E_AMP2 and LGT2 are arranged along the horizontal middle boundary region. For the imaging pixels, the RST transistors are arranged at outer portions of the horizontal middle boundary region and the SEL and AMP transistors are arranged along the bottom boundary region. This arrangement further simplifies the EVS BEOL wiring, and results in a relatively smaller EVS wiring impact area.

Figure 13:
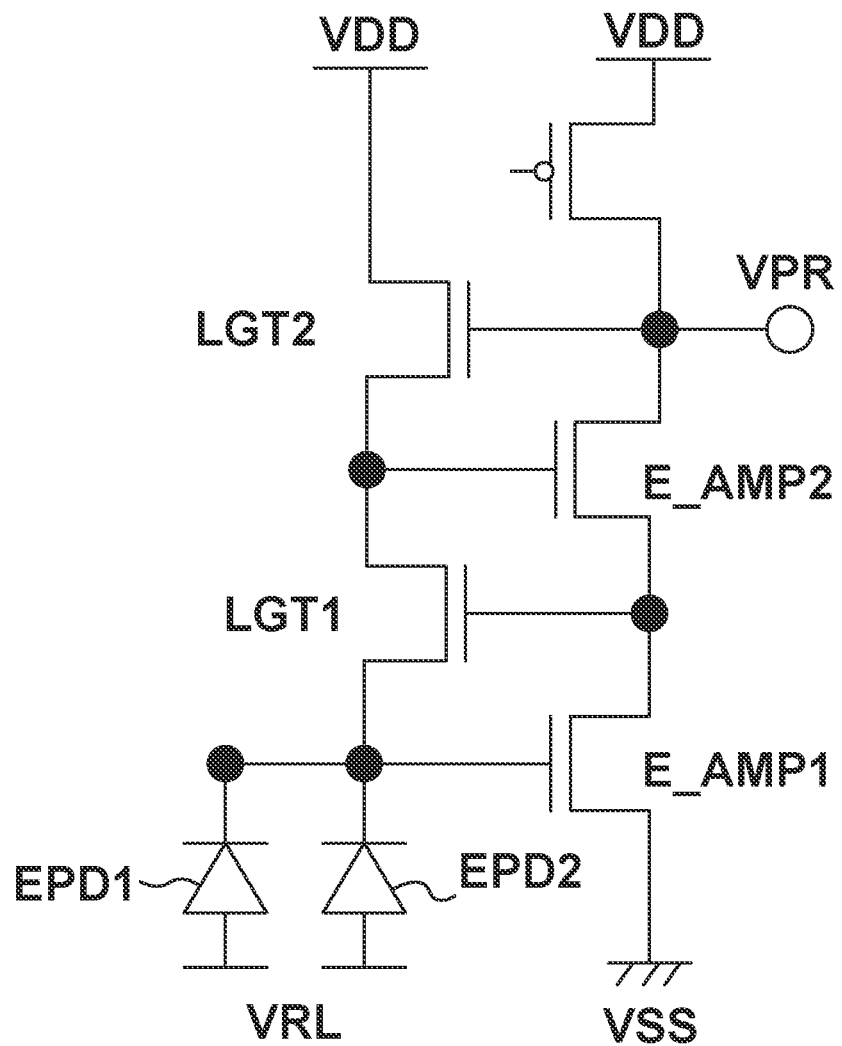
FIG. 13 is a circuit diagram illustrating another example of EVS pixel circuitry.

FIG. 13 is a circuit diagram illustrating another example of EVS pixel circuitry 1300. Here, the number of EVS pixels/PDs in the unit cell is reduced to two (EPD1, EPD2). The remaining circuitry LGT1, LGT2, E_AMP1, E_AMP2 is as set forth and described in connection with FIG. 6A above.

Figure 14:
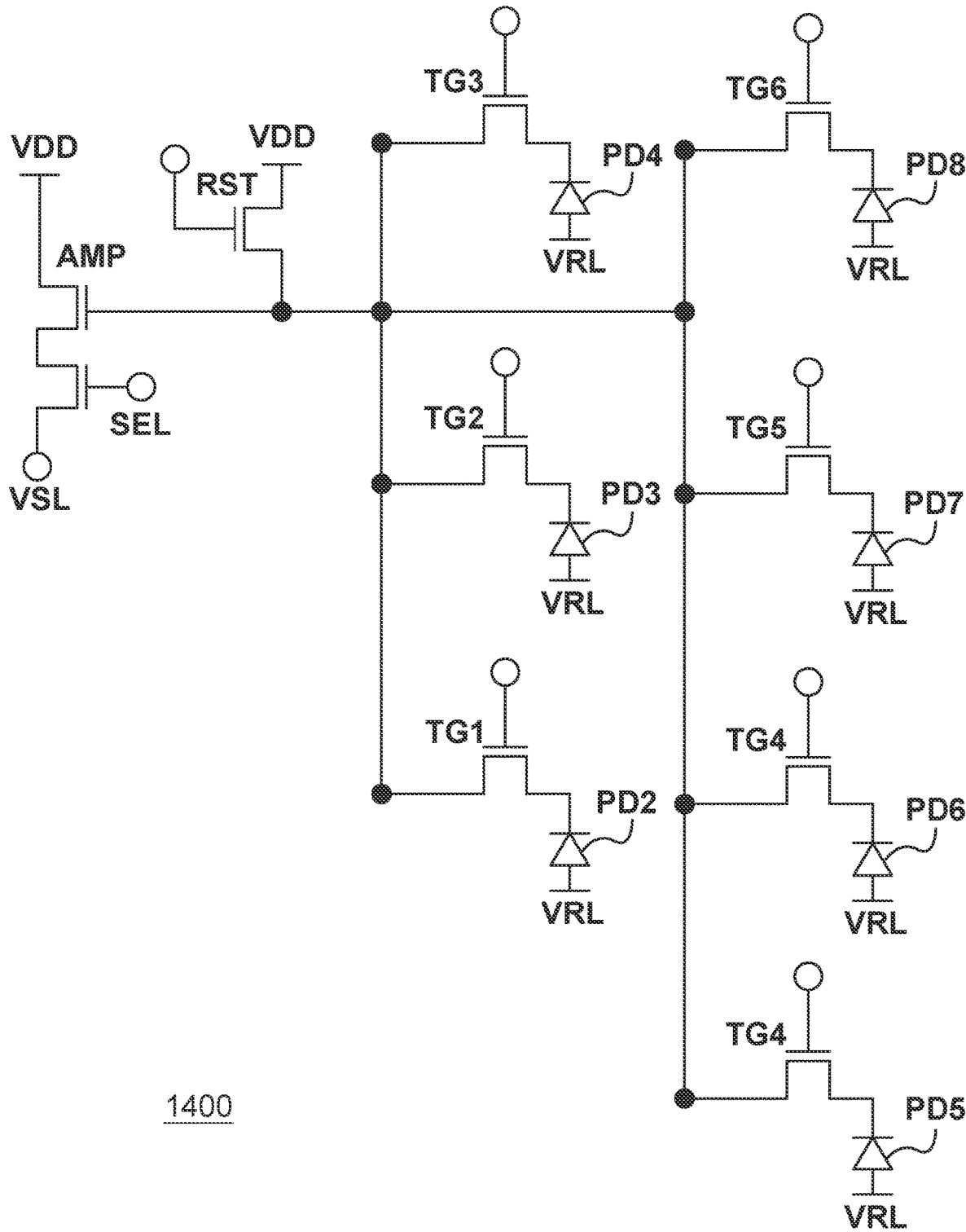
FIG. 14 is a circuit diagram illustrating another example of imaging pixel circuitry.

FIG. 14 is a circuit diagram illustrating another example of imaging pixel circuitry 1400, arranged according to the example of FIG. 13. Since there are two fewer EVS pixels in the unit cell, there are two more imaging pixels/PDs in the unit cell (PD7, PD8). As with the other imaging pixels, these imaging pixels have corresponding transfer transistors TG7 and TG8. The remaining circuitry AMP, SEL, RST, PD1-6, TG1-6 is as set forth and described in connection with FIG. 6B above.

Figure 15:
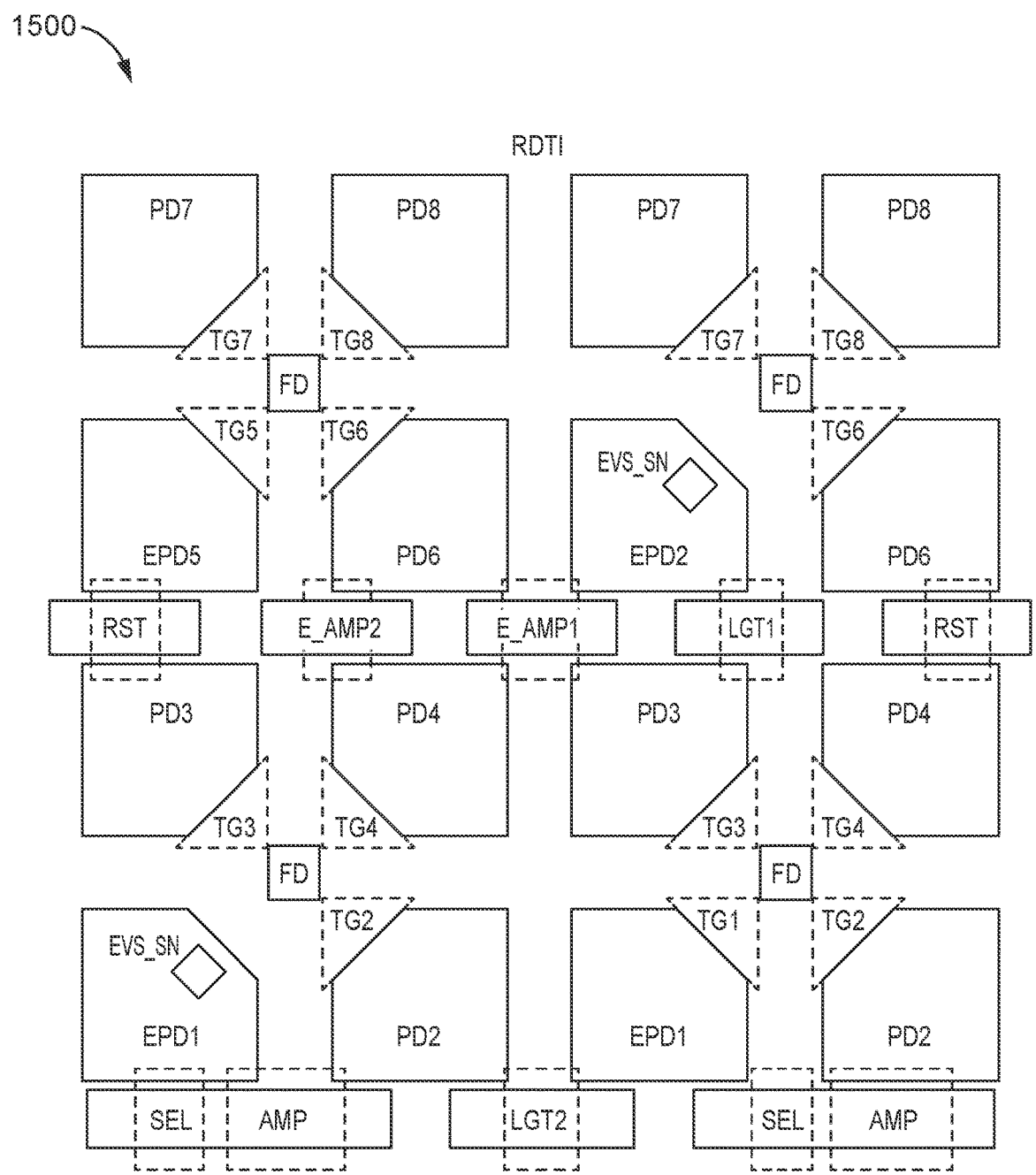
FIG. 15 is a layout diagram illustrating another example of a layout including EVS pixels and imaging pixels.

FIG. 15 is a layout diagram illustrating another example of a pixel unit cell layout 1500 including EVS pixels and imaging pixels. This layout 1500 is consistent with the EVS pixel circuitry and imaging pixel circuitry of FIGS. 13 and 14. As is evident, the pixel unit cell layout 1500 includes two EVS pixels corresponding to EPD1 and EPD2. The transistor layer includes RST, E_AMP1, E_AMP2 and LGT1 transistors arranged along a middle RDTI boundary region, and SEL, AMP, LGT2 arranged along a bottom boundary region in the plan view of FIG. 15. This examples retains a relatively large PD area, and increases the ratio of imaging to EVS pixels, resulting in better image quality, but potentially lower event sensitivity.

Figure 16:
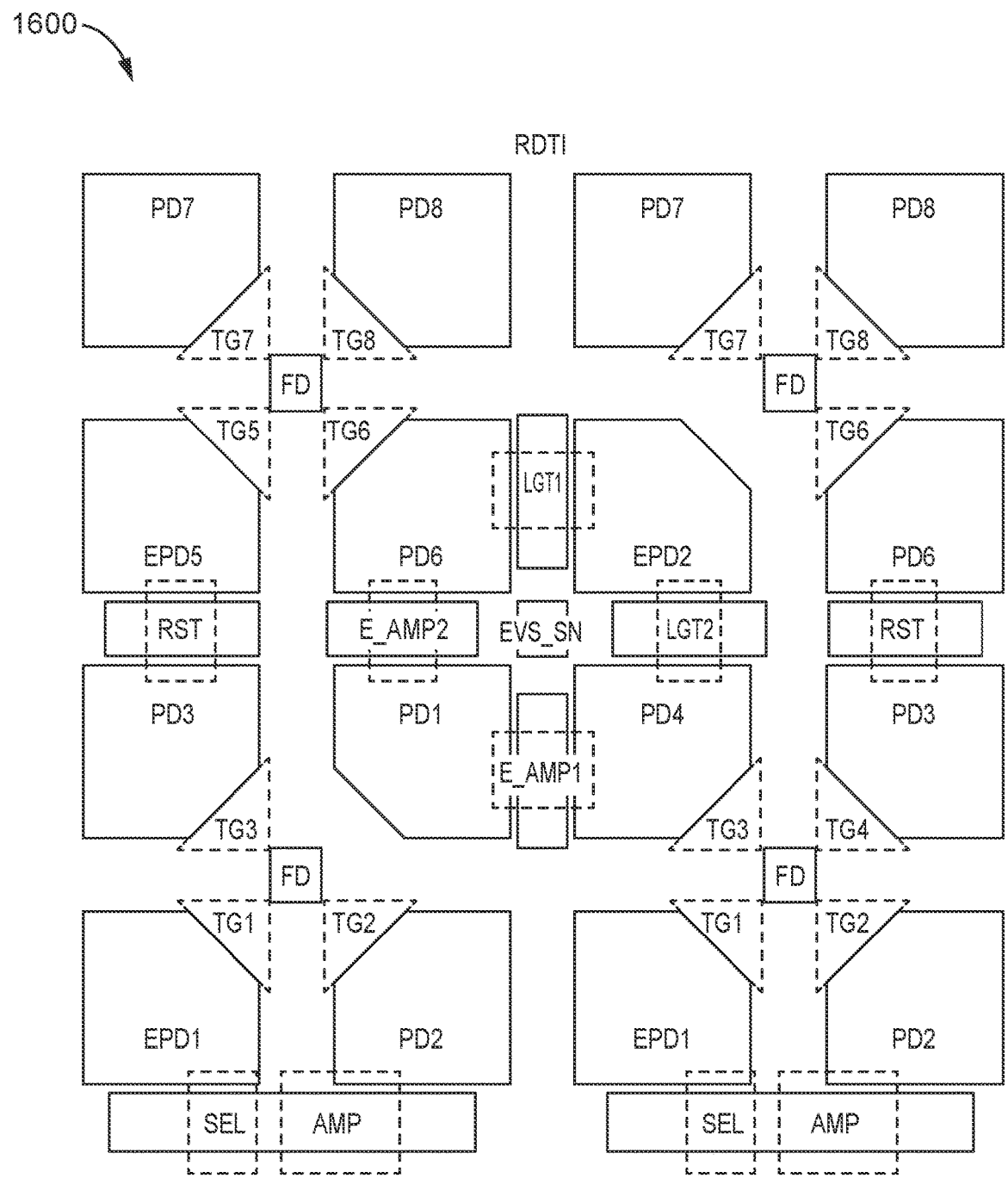
FIG. 16 is a layout diagram illustrating another example of a layout including EVS pixels and imaging pixels.

FIG. 16 is a layout diagram illustrating another example of a pixel unit cell layout 1600 including EVS pixels and imaging pixels. This layout 1600 is also consistent with the example circuitry of FIGS. 13 and 14. Here, the EVS pixels and corresponding circuitry is localized at the middle portion of the pixel unit cell. In the transistor layer, the EVS pixel transistors E_AMP2 and LGT2 are arranged along a central portion of the middle horizontal boundary region, and the transistors E_AMP1 and LGT1 are arranged along a central portion of the middle vertical boundary region. The imaging pixel transistors RST are arranged at outer portions of the middle horizontal boundary region, and the transistors SEL and AMP are arranged along the lower (horizontal) boundary region. The proximity of the EVS pixels and corresponding circuitry results in a reduced EVS wiring impact area.

Figure 17:
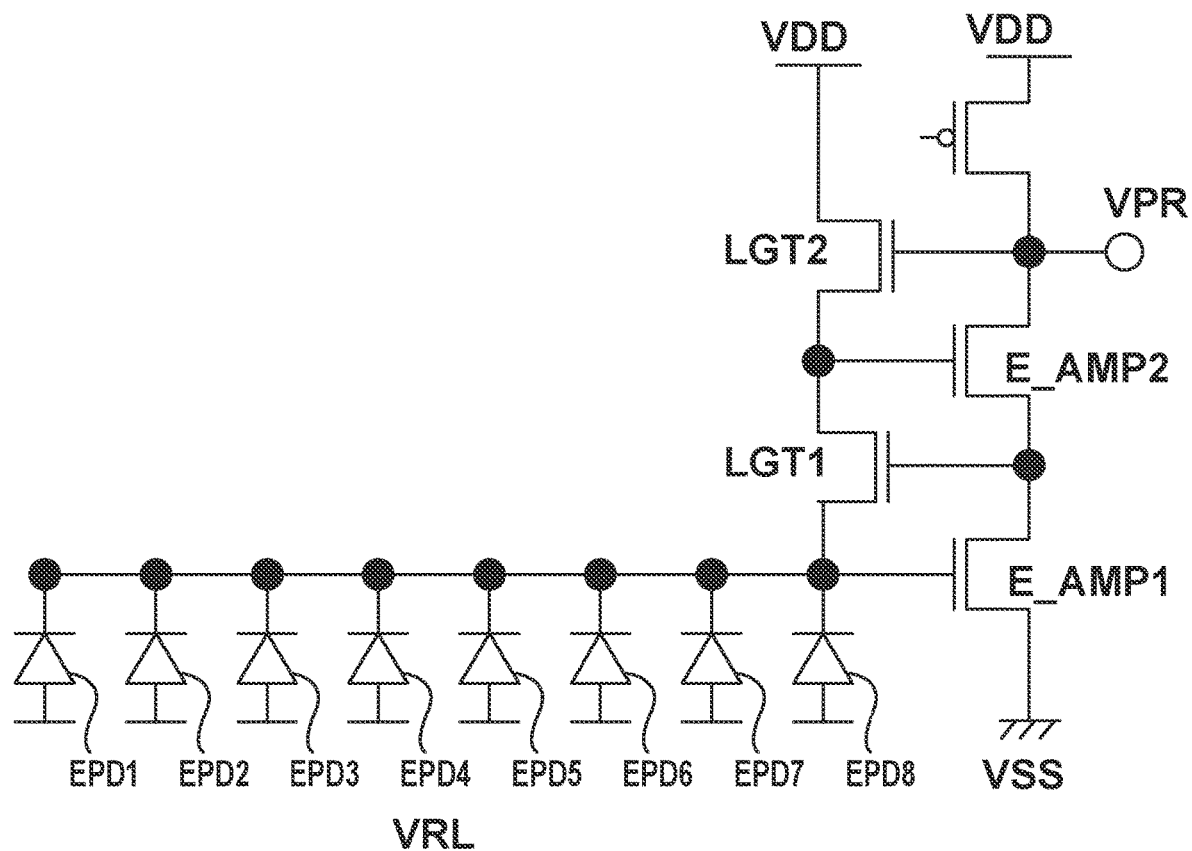
FIG. 17 is a circuit diagram illustrating another example of EVS pixel circuitry.
Figure 18:
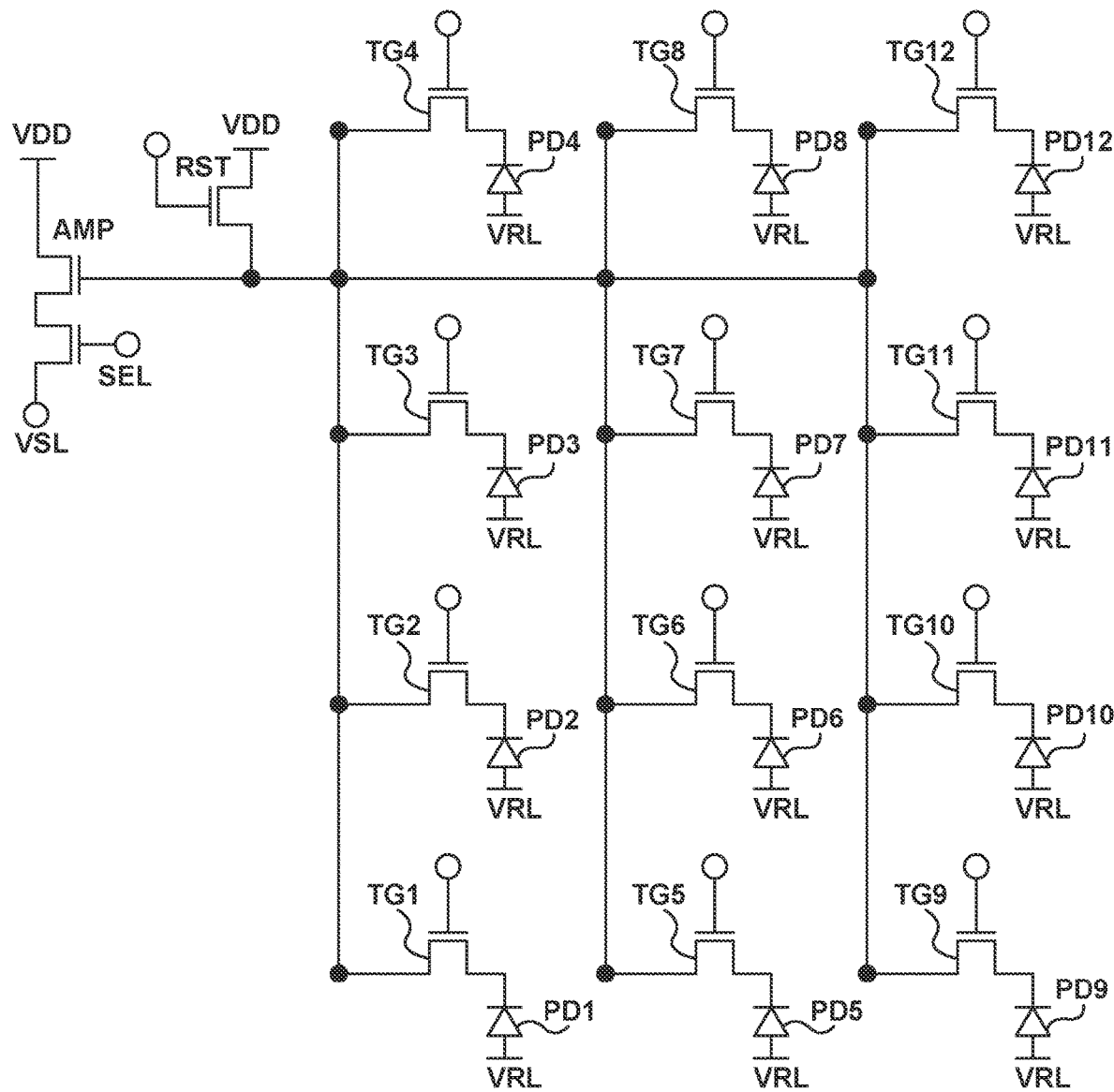
FIG. 18 is a circuit diagram illustrating another example of imaging pixel circuitry.
Figure 19:
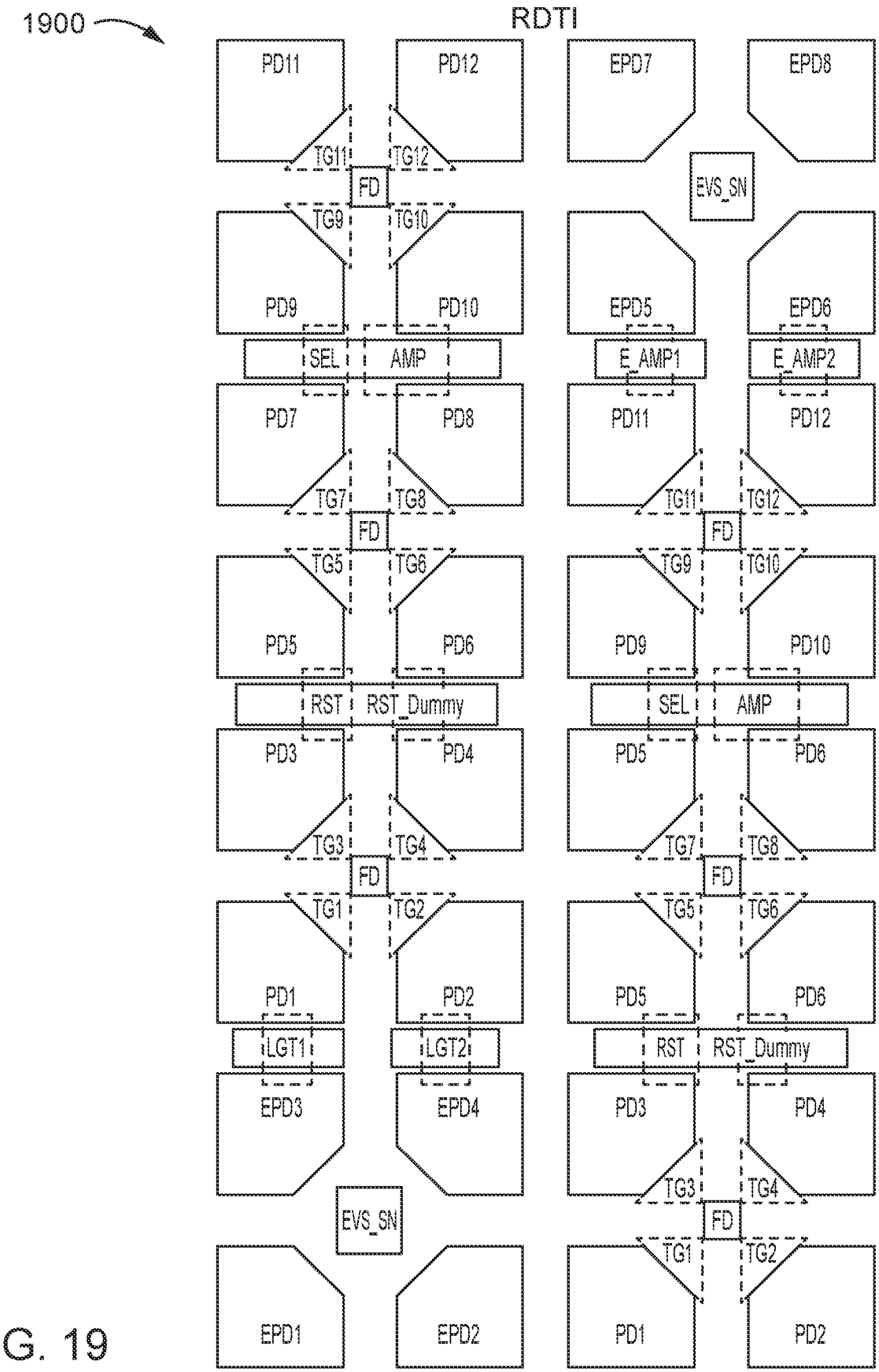
FIG. 19 is a layout diagram illustrating another example of a layout including EVS pixels and imaging pixels.

FIGS. 17-19 correspond to an example where the number of PDs in the pixel unit cell is increased to 8 EVS pixels and 24 imaging pixels. FIG. 17 is a circuit diagram illustrating the EVS pixel circuitry 1700, which includes EPD1-8. The remaining circuitry is as described in FIG. 6A. FIG. 18 is a circuit diagram illustrating the imaging pixel circuitry 1800, which includes PD1-12 and corresponding TG1-12. Again, there are two instances of the imaging pixel circuitry 1800 for the pixel unit cell and the remaining circuitry is as described in FIG. 6B. The pixel unit cell layout 1900 of FIG. 19 has the EVS pixels (EDP1-8) concentrated at upper right and lower left locations of the pixel unit cell. The transistor layer includes the EVS pixel circuitry and imaging pixel circuitry dispersed along three horizontal boundary regions. Specifically, the SEL, AMP, E_AMP1 and E_AMP2 transistors are arranged along a first horizontal boundary region, the RST, RST_Dummy, SEL and other AMP transistors are arranged along a second horizontal boundary region, and the LGT1, LGT2, other RST and other RST_Dummy transistors are arranged along a third horizontal boundary region.

Figure 20:
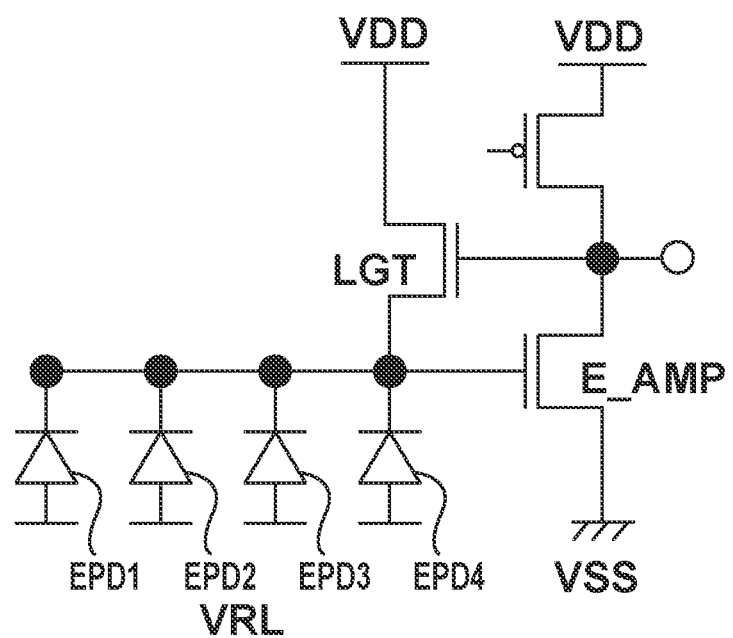
FIG. 20 is a circuit diagram illustrating another example of EVS pixel circuitry.
Figure 21:
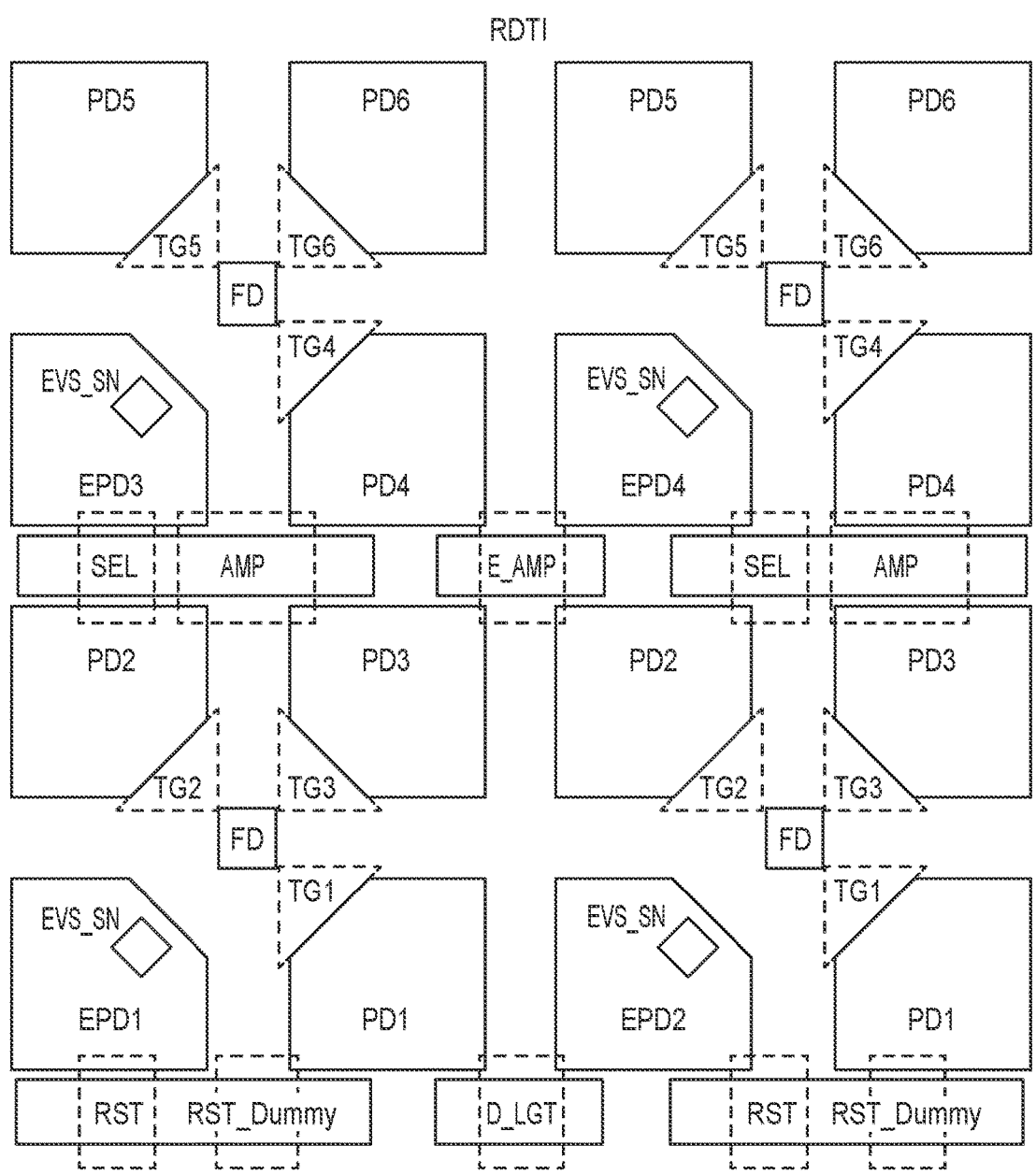
FIG. 21 is a layout diagram illustrating another example of a layout including EVS pixels and imaging pixels.

FIGS. 20-21 illustrate another example of EVS pixel circuitry 2000 and a corresponding pixel unit cell layout 2100. This example implements simplified EVS pixel circuitry 2000, omitting one log transistor and one amplifier transistor, to include only log transistor LGT and amplifier transistor E_AMP. The imaging pixel circuitry for the 12 imaging pixels is the same as FIG. 6B. In the pixel unit cell layout 2000, the transistor layer includes transistors SEL, AMP, E_AMP along a middle horizontal boundary region, and transistors RST, RST_Dummy and LGT along a bottom horizontal boundary region. This arrangement simplifies the wiring for the EVS pixel circuitry.

Figure 22:
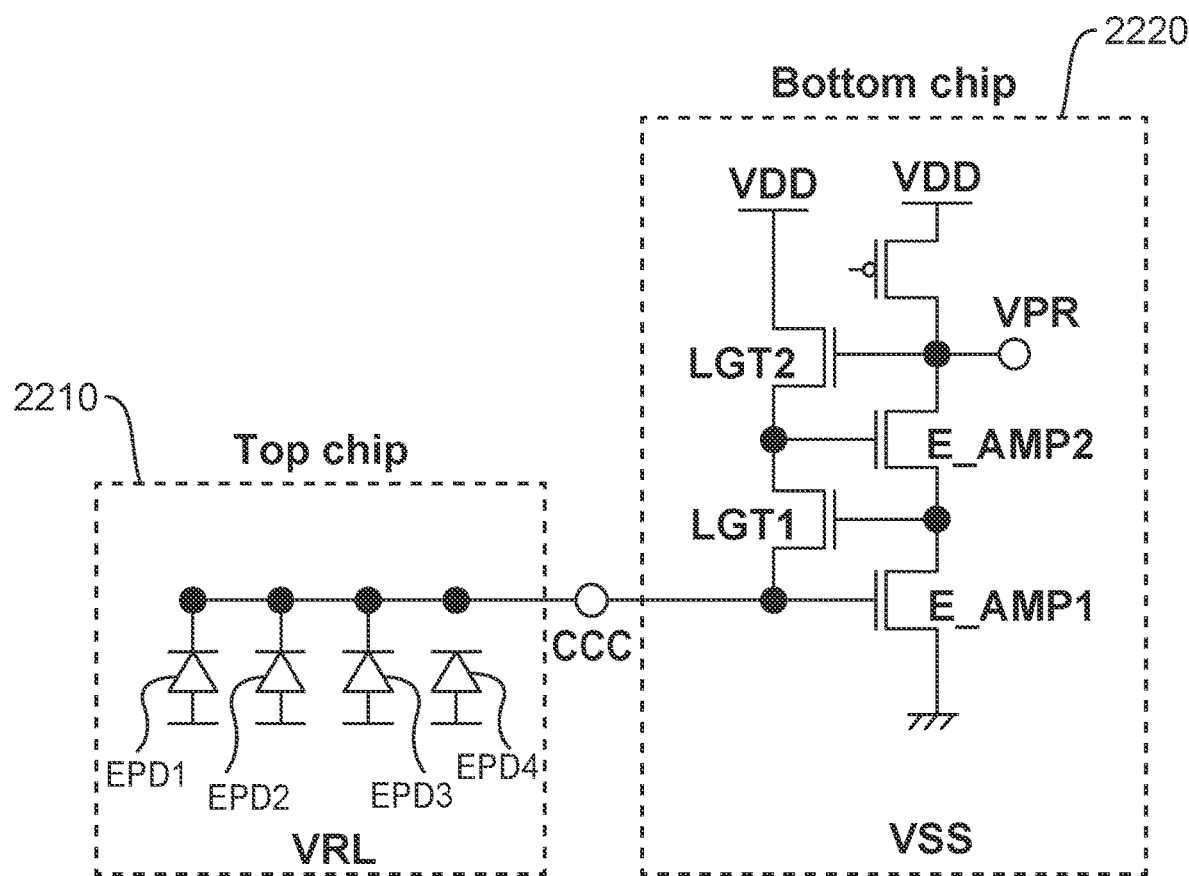
FIG. 22 is a circuit diagram illustrating another example of EVS pixel circuitry.
Figure 23:
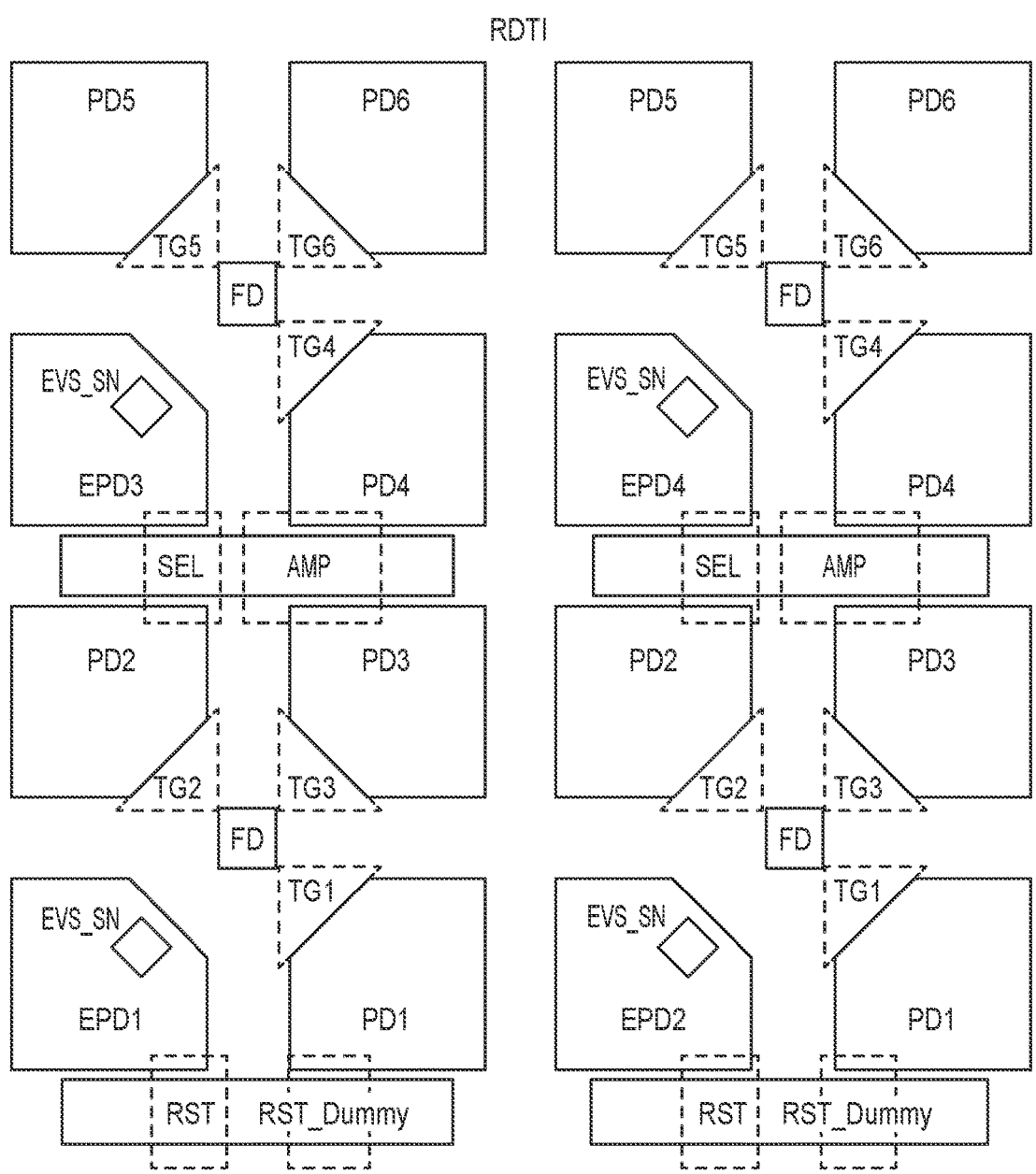
FIG. 23 is a layout diagram illustrating another example of a layout including EVS pixels and imaging pixels.

FIGS. 22-23 illustrate another example of EVS pixel circuitry and a corresponding pixel unit cell layout 2300. In the EVS pixel circuitry, the EVS PDs EPD1-4 remain in the top chip (FIG. 2, 210) but the corresponding EVS pixel circuitry is moved to the bottom chip (FIG. 2, 220). As illustrated in the pixel unit cell layout 2300, this requires only the imaging pixel circuitry transistors SEL, AMP, RST and RST_Dummy to be located at the transistor layer in the top chip. This allows four EVS pixels to be retained in the pixel unit cell, while still reducing the wiring complexity in the transistor layer of the top chip.

Figure 24:
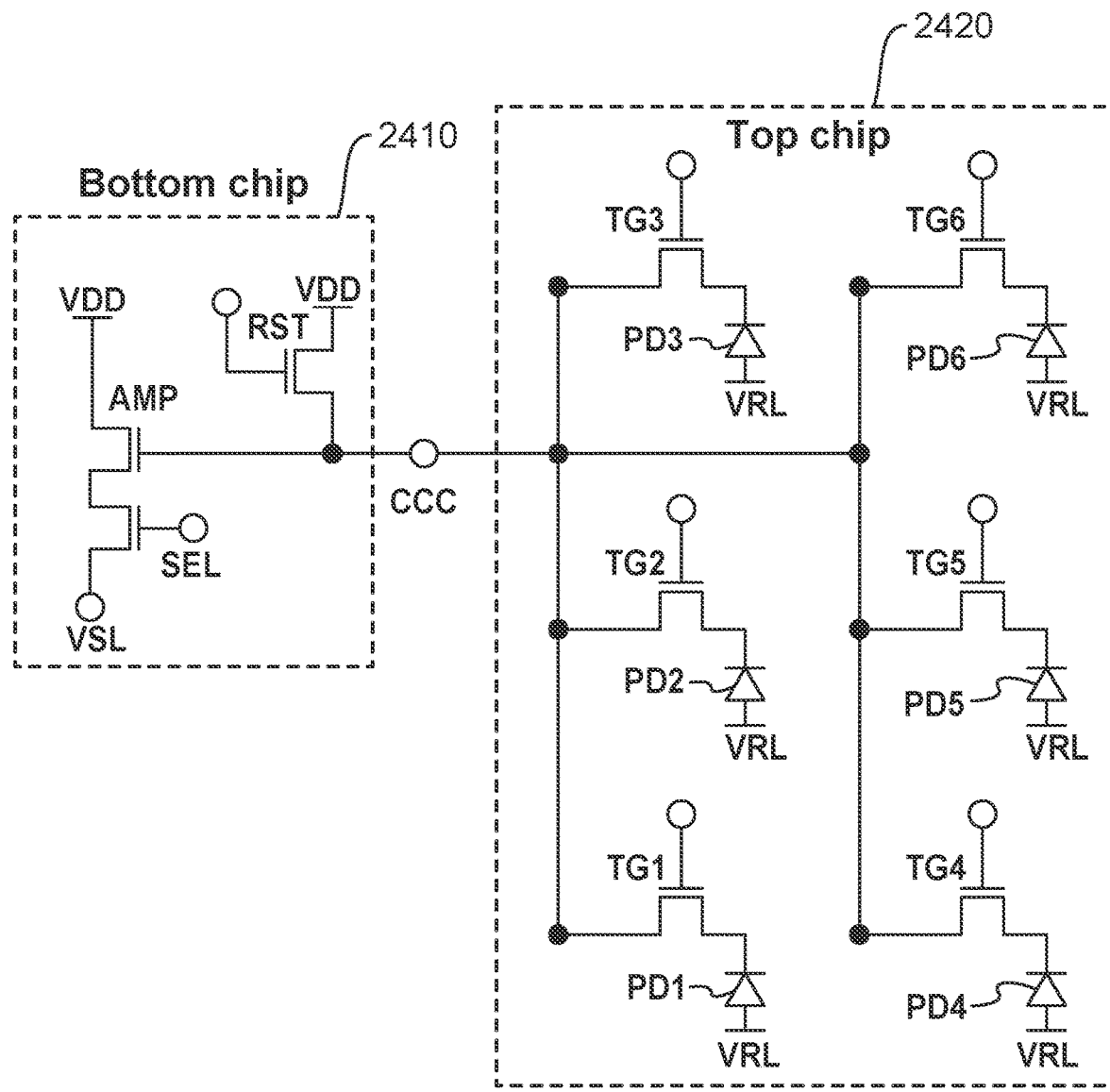
FIG. 24 is a circuit diagram illustrating another example of imaging pixel circuitry.
Figure 25:
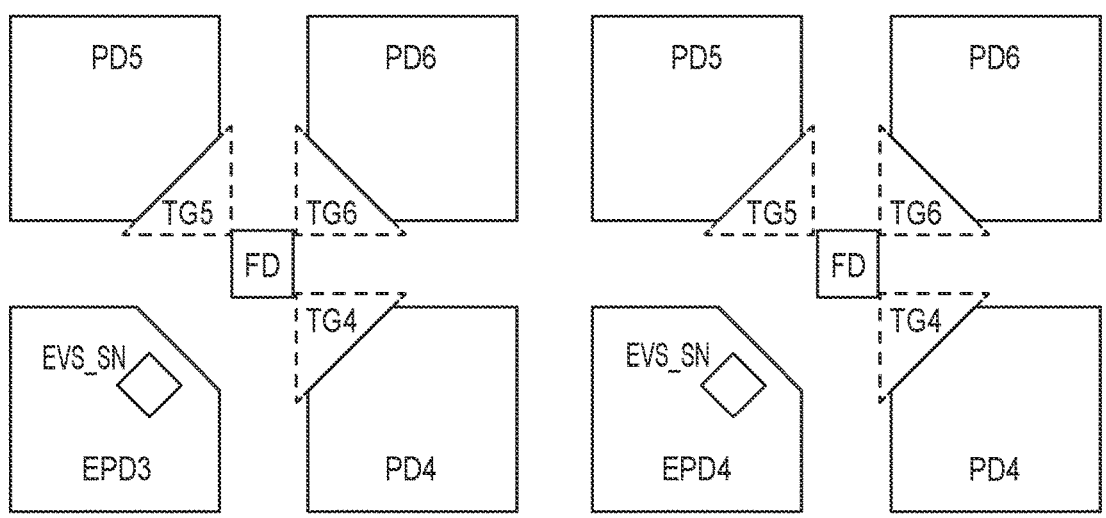
FIG. 25 is a layout diagram illustrating another example of a layout including EVS pixels and imaging pixels.
Figure 25:
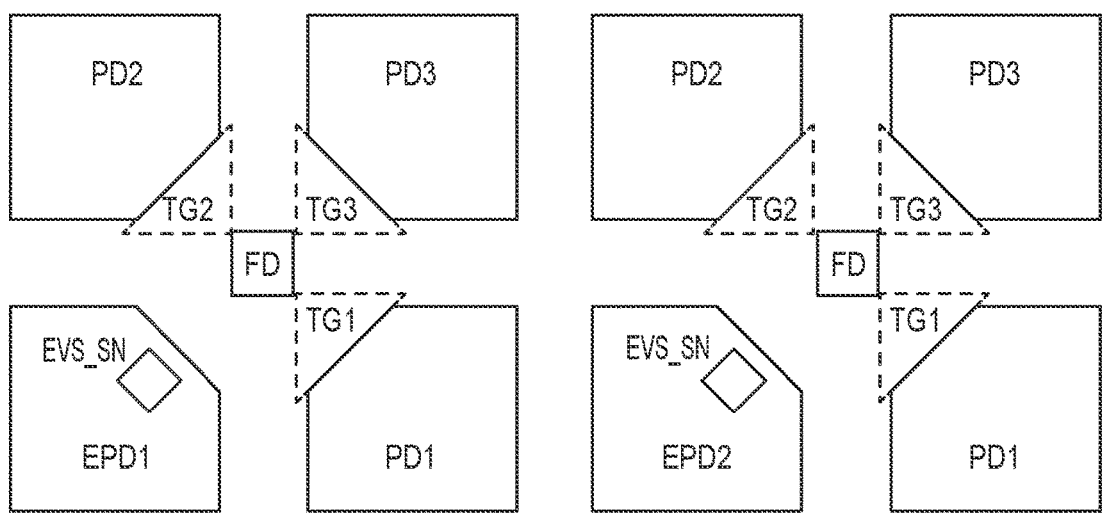

FIGS. 24-25 illustrate another example of imaging pixel circuitry and a corresponding pixel unit cell layout 2500. In the imaging pixel circuitry, the PDs PD1-6 (times 2) remain in the top chip (FIG. 2, 210) but the corresponding imaging pixel circuitry is moved to the bottom chip along with the EVS pixel circuitry (FIG. 2, 220). As illustrated in the pixel unit cell layout 2500, this even further simplifies the wiring at the transistor layer of the top chip, and also further reduces the potential impact of capacitive interaction between the various wiring.

Figure 26:
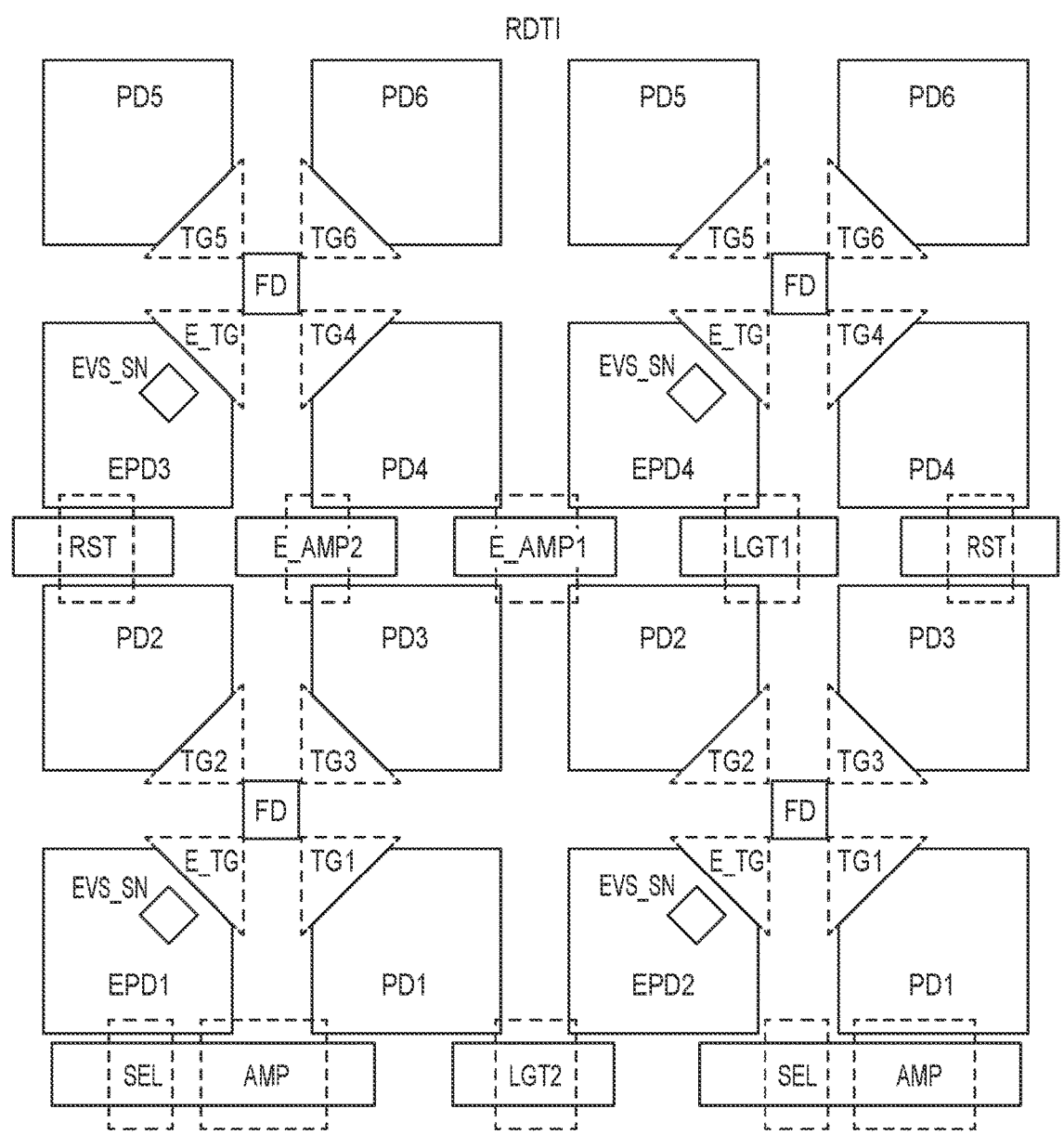
FIG. 26 is a layout diagram illustrating another example of a layout including EVS pixels and imaging pixels.

FIG. 26 is a layout diagram illustrating another example of a pixel unit cell layout 2600 including EVS pixels and imaging pixels. Here, dummy transfer gates E_TG are added for each of the EVS pixels. This produces a more uniform structure with higher EVS sensitivity while retaining the relatively large PD area, as well as controllable isolation for the EVS PDs through the dummy TG.

Figure 27A:
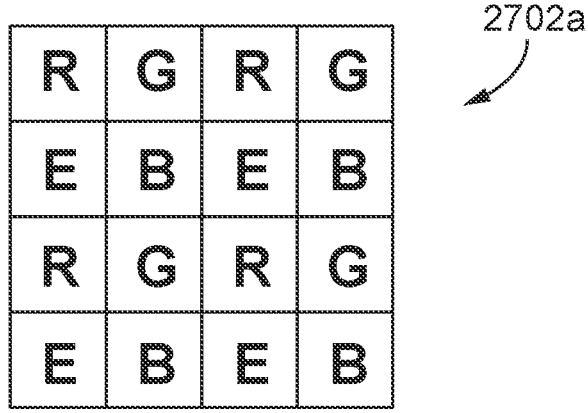
FIGS. 27A-C are schematic diagrams illustrating other examples of EVS and imaging pixels.
Figure 27B:
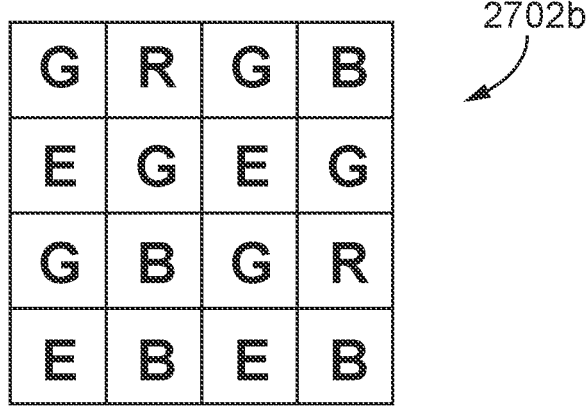
Figure 27C:
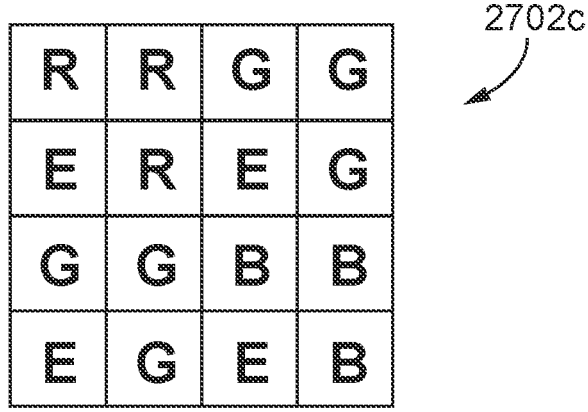

FIGS. 27A-C are schematic diagrams illustrating other examples of pixel unit cells 2702a-c in plan view, as alternatives to the example of FIG. 4A. Each of the pixel unit cells 2702a-c comprise sixteen subpixels arranged in a 4×4 two-dimensional matrix array, i.e., in four rows and four columns, and again they include four EVS subpixels and twelve imaging subpixels, individually labeled R, G, B. Again, within the unit cell, the subpixels may also be referred to as pixels, e.g., EVS pixels and imaging pixels. The patterns in FIGS. 4A and 27A-C may be implemented in some or all of the pixel unit cell embodiments disclosed herein.

Figure 28A:
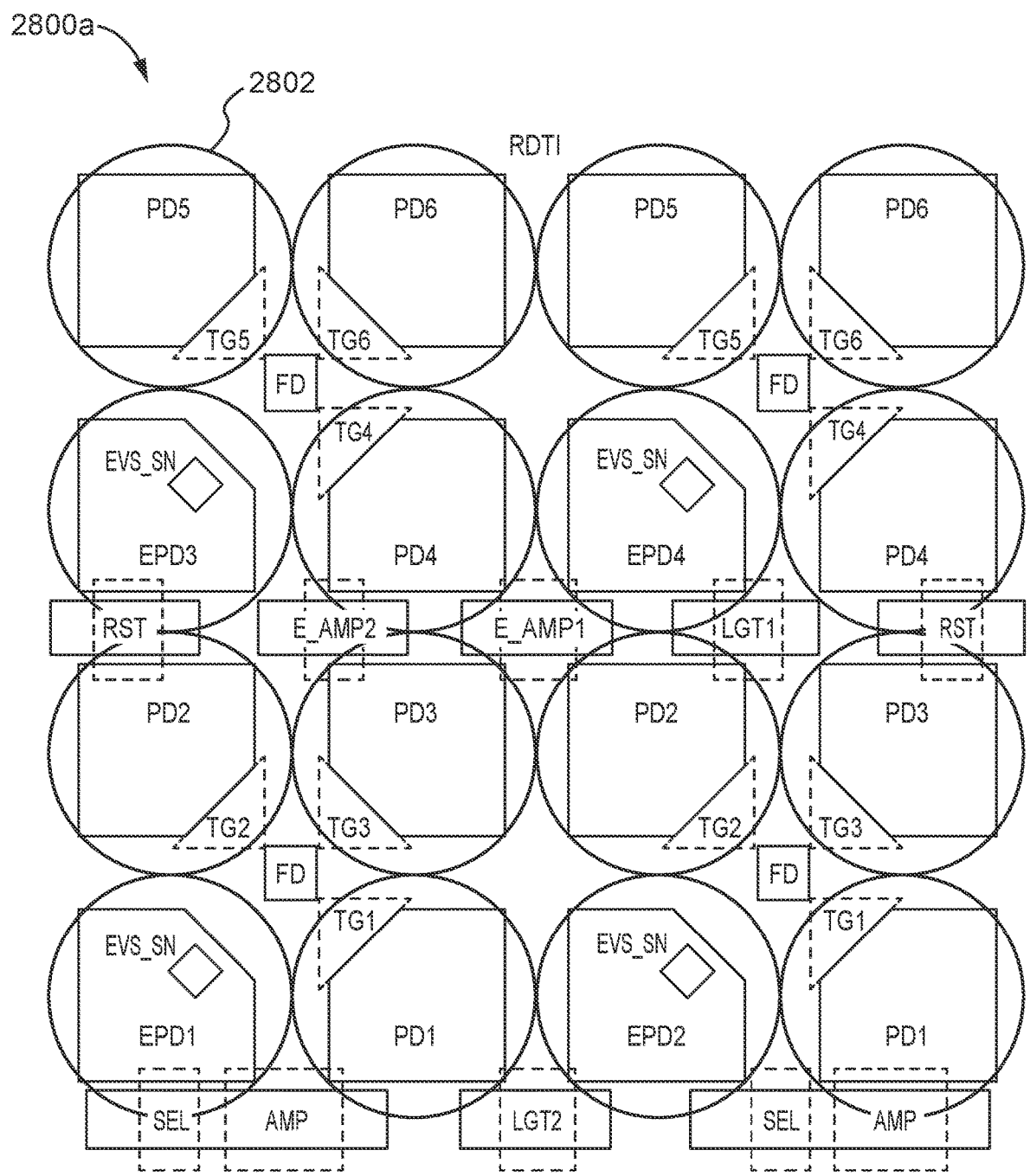
FIGS. 28A-C are layout diagrams illustrating examples of layouts including EVS pixels, imaging pixels and on-chip-lens arrangements.
Figure 28B:
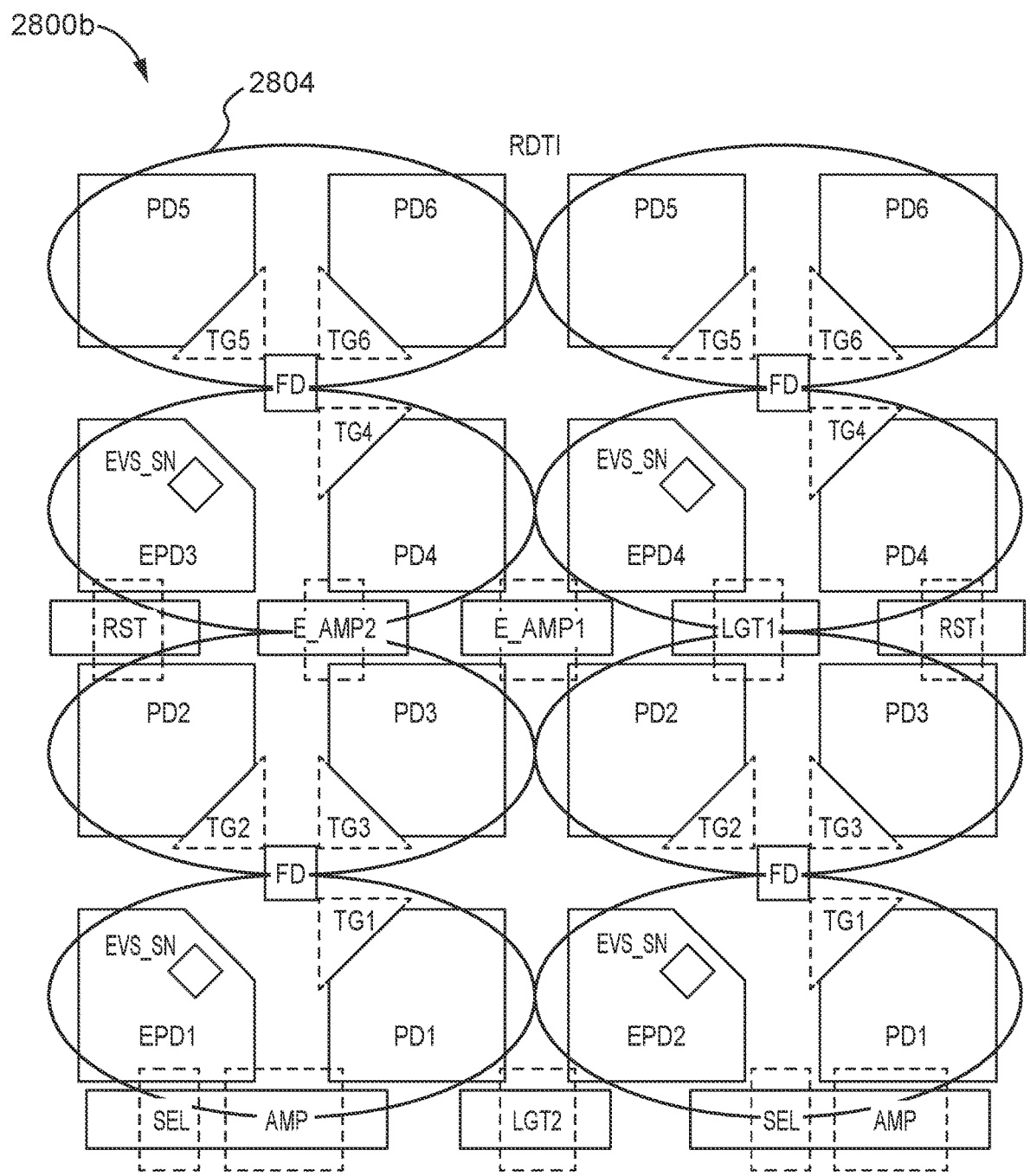
Figure 28C:
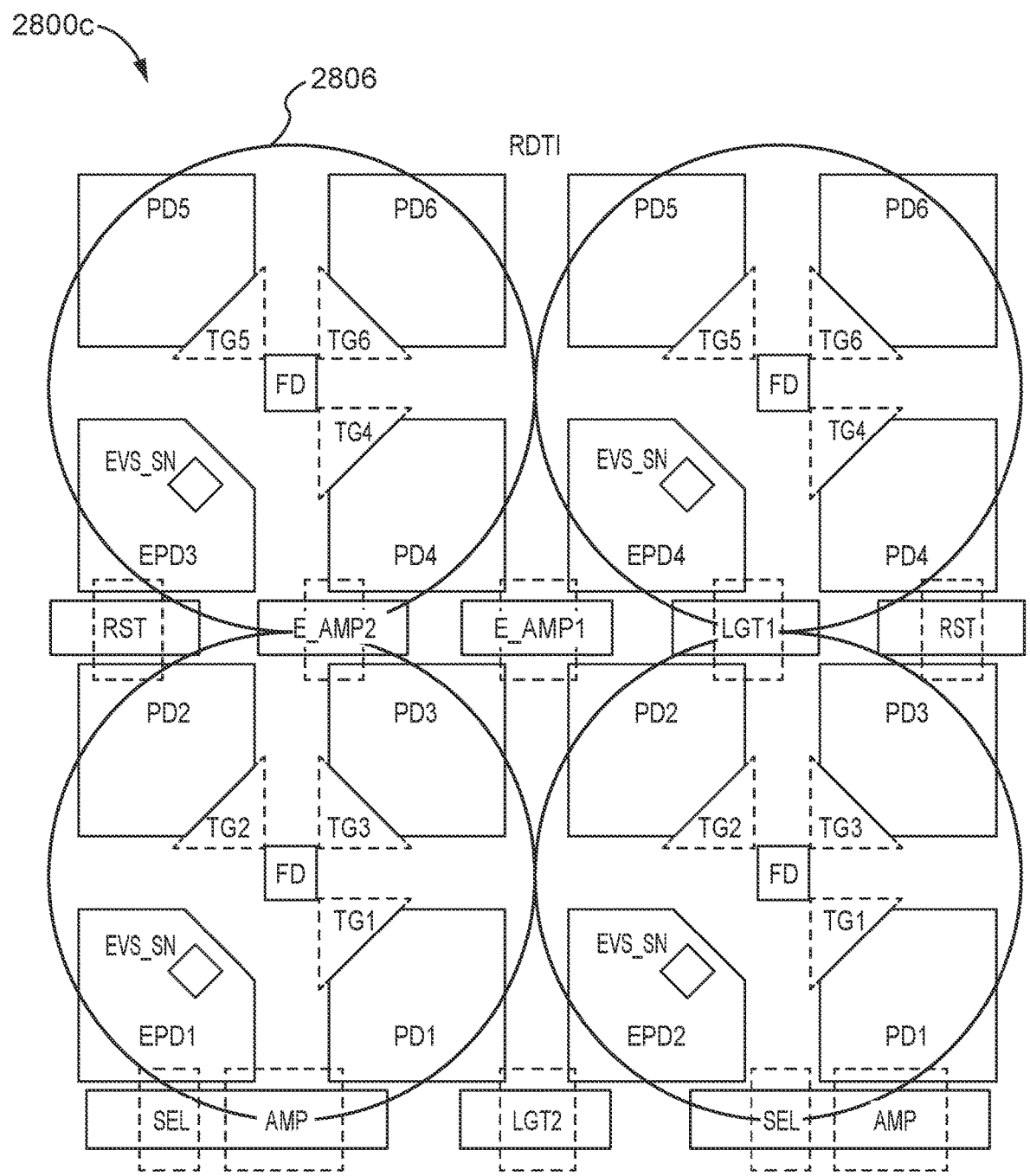

FIGS. 28A-C are pixel unit cell layouts 2800a-c that also include illustrations of examples of on-chip-lens arrangements. FIG. 28A shows the on-chip lenses (OCL) 2802 in a 1×1 configuration (i.e., one OCL per pixel). This configuration is suitable for any of the examples of pixel unit cells, and is suitable for optimal performance for each pixel. FIGS. 28B and 28C illustrate the OCLs 2804 in a 2×1 configuration and the OCLs 2806 in a 4×1 configuration. These examples are also suitable for any of the examples of pixel unit cells. They are also suitable for implementations that use phase detection autofocus (PDAF).

Figure 29:
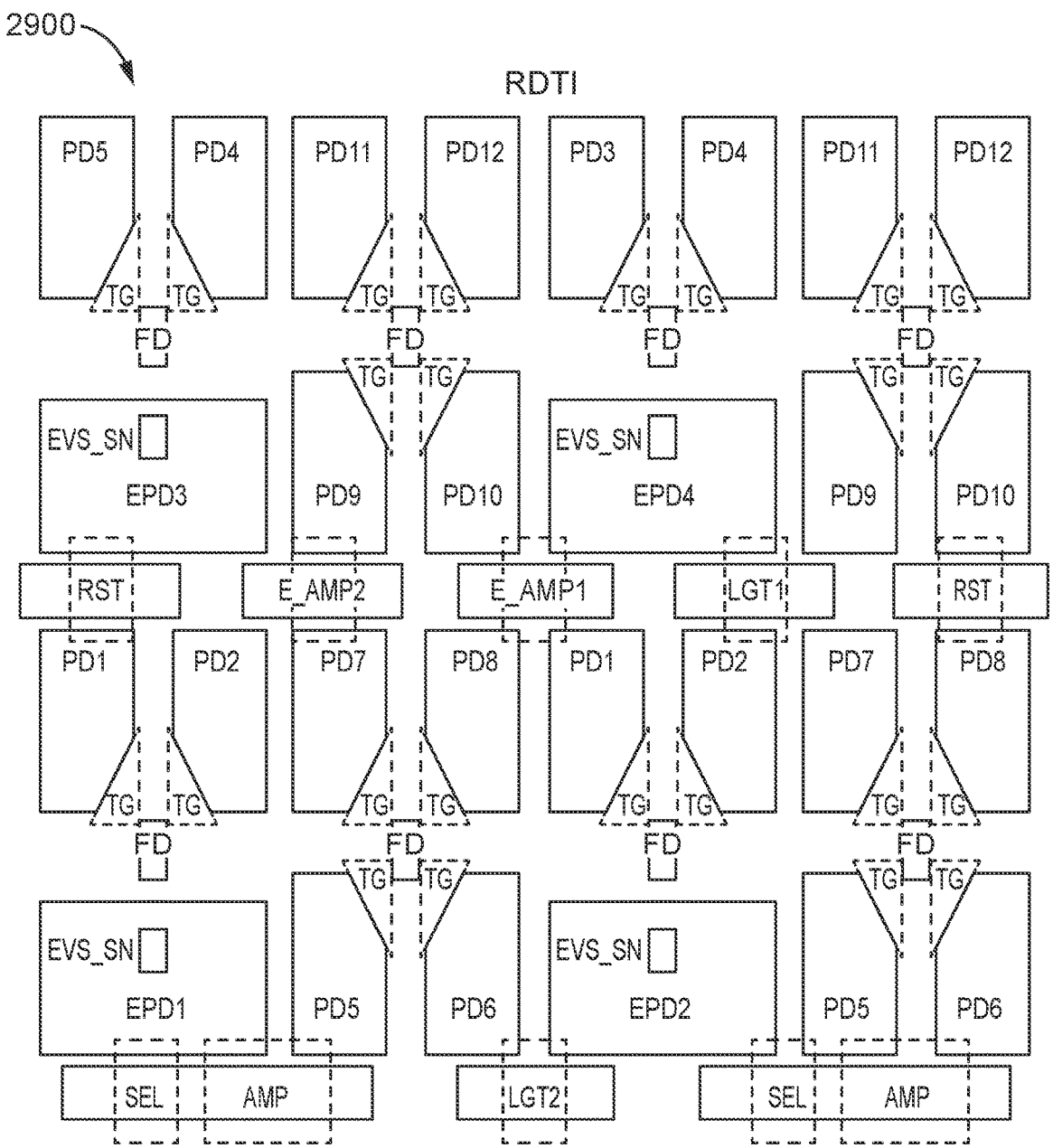
FIG. 29 is a layout diagram illustrating another example of a layout including EVS pixels and imaging pixels.

FIG. 29 illustrates another example of a pixel unit cell layout 2900 including EVS pixels and imaging pixels. Here, the imaging pixels are rectangularly shaped with half the size area as compares to the prior examples. The corresponding EVS pixel circuitry and imaging pixel circuitry is the same as illustrated and described in FIG. 6A and FIG. 18. The transistor layer similarly includes both imaging pixel and EVS pixel transistors arranged along boundary regions. This pixel unit cell layout 2900 is also suitable for PDAF implementations.

Figure 30A:
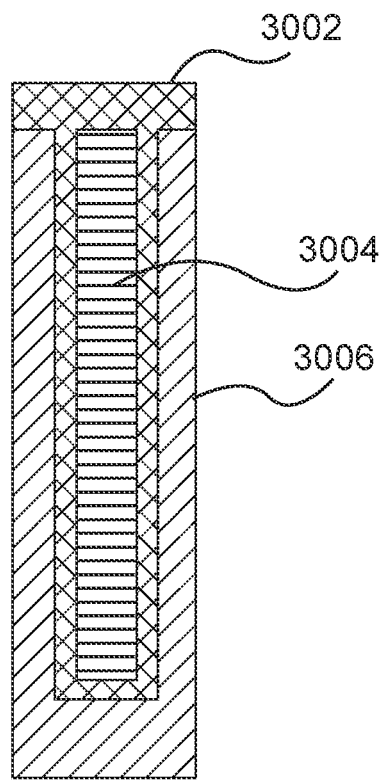
FIGS. 30A-B are cross-sectional diagrams illustrating examples of rear deep trench isolation (RDTI) profiles.
Figure 30B:
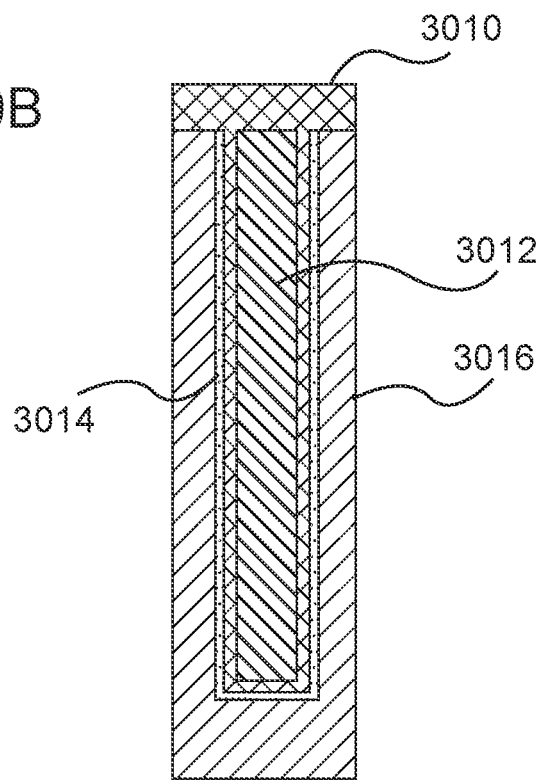

FIGS. 30A-B are cross-sectional diagrams illustrating examples of the RDTI structures used to form the RDTI boundary regions. The RDTI of FIG. 30A includes an (e.g., epitaxial) silicon layer 3006 that extends alongside the PD regions to form the PD separation boundaries (e.g., FIG. 4B). An internal polysilicon layer 3004 extends in the same direction and is separated from the epi silicon layer 3006 by a dielectric layer 3002 (e.g., oxide, nitride). The RDTI of FIG. 30B also includes a silicon layer 3016 extending alongside the PD regions, with an internal metal layer 3012 (e.g., tungsten) extending in the same direction, and intervening passivation 3011 and dielectric 3010 layers.

Figure 31:
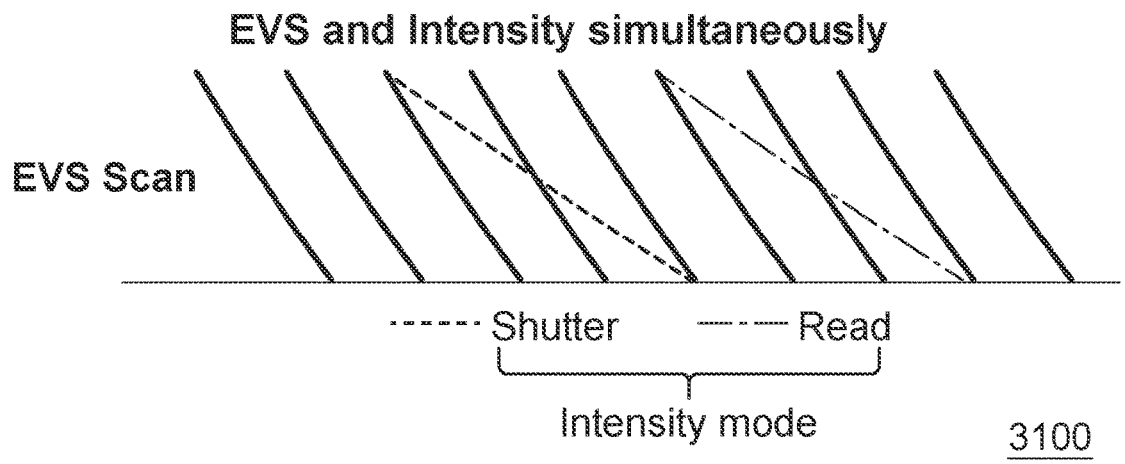
FIGS. 31-32 are timing diagrams illustrating simultaneous EVS and imaging pixel readout processes.
Figure 32:
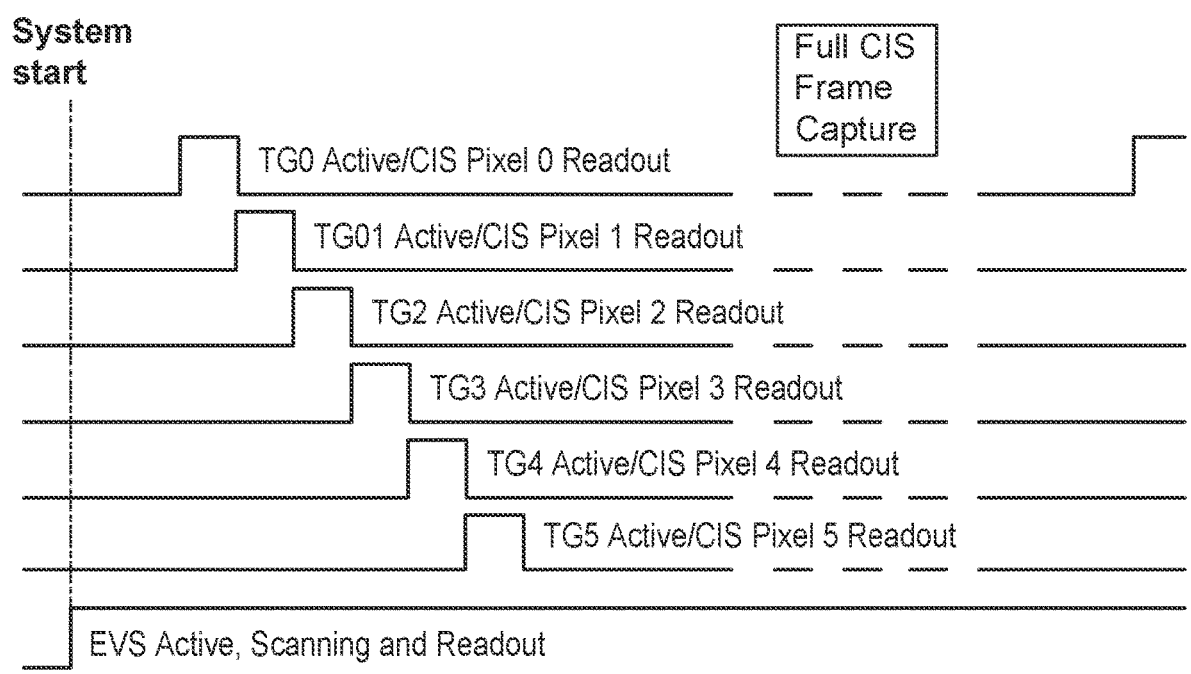

FIGS. 31-32 are timing diagrams illustrating simultaneous EVS and imaging pixel readout processes 3100, 3200. The EVS pixel circuitry (e.g., FIG. 6A) is arranged to omit switch control so that event detection remains active throughout the period. The imaging pixel circuitry (e.g., FIG. 6B) is arranged such that the transfer gates are sequentially turned on as part of the readout mode.

Figure 33:
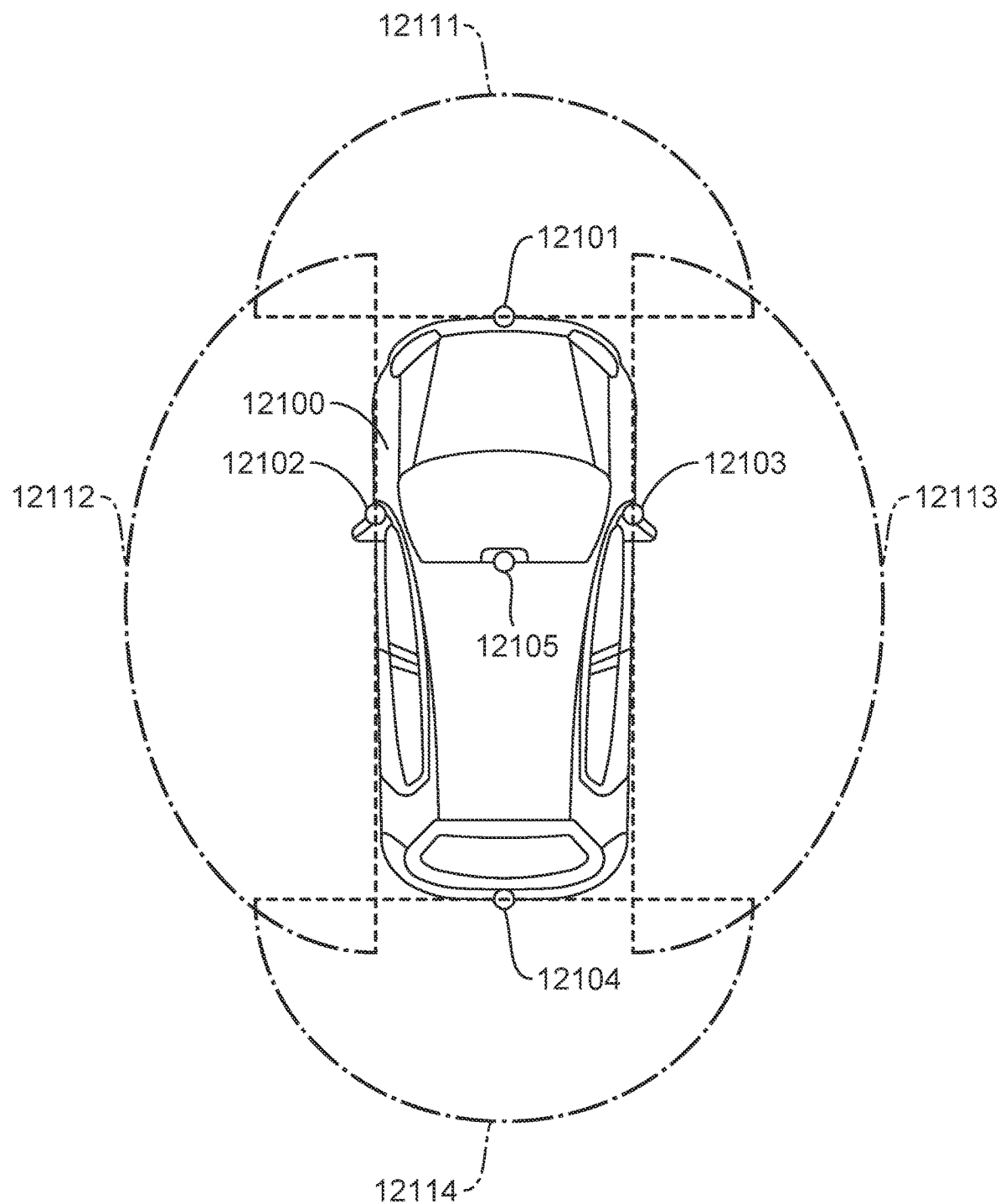
FIG. 33 is a schematic diagram illustrating an implementation example of image sensors in an automotive environment.

FIG. 33 is a schematic diagram illustrating an implementation example of imaging devices 12101, 12102, 12103, 12104, and 12105 located at positions such as a front nose, a side-view mirror, a rear bumper, a back door, and an upper side of a windshield of vehicle 12100. Each of these imaging devices may implement one or more of the examples of image sensing including a pixel array with the EVS and imaging pixels as described previously. The ranges 12111, 12112, 12113 and 12114 of the externally facing imaging devices 12101 to 12104 are also illustrated. At least one of the imaging devices 12101 to 12105 may have a function of acquiring distance information. Additionally, the imaging devices 12101 to 12105 include the EVS pixels for performing event sensing. A corresponding computer system may coordinate with the imaging devices 12101 to 12105 to perform three-dimensional object detection, distance control, brake control, acceleration control, and the like.

The examples described in this specification are merely examples and are not restrictive of the disclosure herein, and other effects may be achieved.

The technology may, for example, have the following configurations.

(1) An image sensing device comprising:
  a pixel array including imaging pixels and event sensing pixels, the pixel array being a two-dimensional array, the imaging pixels and the event sensing pixels being interspersed in the pixel array;
  imaging pixel circuitry configured to provide image signals from the imaging pixels; and
  event sensing pixel circuitry configured to provide an event signal from the event sensing pixels.

(2) The image sensing device according to (1), further comprising:
  a trench isolation around each of the imaging pixels and the event sensing pixels in the pixel array.

(3) The image sensing device according to (2), wherein a first transistor in the imaging pixel circuitry and a second transistor in the event sensing pixel circuitry are respectively arranged below the trench isolation in a cross-section view.

(4) The image sensing device according to (2), wherein the two-dimensional array extends in a horizontal direction and a vertical direction, and the trench isolation forms a first boundary region that extends in the horizontal direction, and a second boundary region that extends in the vertical direction.

(5) The image sensing device according to (4), wherein a first transistor in the imaging pixel circuitry and a second transistor in the event sensing pixel circuitry are respectively arranged below the first boundary region in a cross-section view.

(6) The image sensing device according to (4), wherein a first transistor in the imaging pixel circuitry is arranged below the first boundary region in a cross-section view, and a second transistor in the event sensing pixel circuitry is arranged below the second boundary region in the cross-section view.

(7) The image sensing device according to (1), wherein the pixel array is formed on a first integrated circuit, and wherein a first transistor in the imaging pixel circuitry and a second transistor in the event sensing pixel circuitry are respectively arranged in a same transistor layer of the first integrated circuit.

(8) The image sensing device according to (1), wherein the image sensing device comprises a stacked assembly including a first part bonded to a second part, the first part including the first integrated circuit and the second part including a second integrated circuit.

(9) The image sensing device according to (8), wherein a third transistor in the event sensing pixel circuitry is arranged in the second integrated circuit.

(10) The image sensing device according to (9), wherein a fourth transistor in the image sensing pixel circuitry is arranged in the second integrated circuit.

(11) The image sensing device according to (1), wherein the event sensing pixels respectively include photodiodes, and the photodiodes are connected in parallel to the event sensing pixel circuitry to provide the event signal.

(12) The image sensing device according to (11), wherein the image sensing pixels respectively include photodiodes, and corresponding different color filters are arranged for individual ones of the image sensing pixels.

(13) The image sensing device according to (12), wherein the imaging pixel circuitry including transfer transistors respectively arranged for each of the photodiodes of each of the image sensing pixels.

(14) The image sensing device according to (13), wherein the event signal for the event sensing pixels is connected for readout without switch gate control.

(15) The image sensing device according to (14), wherein the image signals are sequentially readout from respective ones of the imaging pixels using the transfer transistors, simultaneous with the event signal readout.

While this disclosure includes references to illustrative embodiments, this specification is not intended to be construed in a limiting sense. Various modifications of the described embodiments, as well as other embodiments within the scope of the disclosure, which are apparent to persons of ordinary skill in the art to which the disclosure pertains are deemed to lie within the scope of the disclosure, e.g., as expressed in the following claims.

Some embodiments may be implemented as circuit-based processes, including possible implementation on a single integrated circuit.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature and principles of this disclosure may be made by those skilled in the pertinent art without departing from the scope of the disclosure, e.g., as expressed in the following claims.

The use of figure numbers and/or figure reference labels (if any) in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Unless otherwise specified herein, in addition to its plain meaning, the conjunction "if" may also or alternatively be construed to mean "when" or "upon" or "in response to determining" or "in response to detecting," which construal may depend on the corresponding specific context. For example, the phrase "if it is determined" or "if [a stated condition] is detected" may be construed to mean "upon determining" or "in response to determining" or "upon detecting [the stated condition or event]" or "in response to detecting [the stated condition or event]."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three dimensional structure as shown in the figures. Such "height" would be vertical where the electrodes are horizontal but would be horizontal where the electrodes are vertical, and so on. Similarly, while some of the figures show different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure. For example, a relatively thin layer of adhesive or other suitable binder can be used to implement such "direct attachment" of the two corresponding components in such physical structure.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

The functions of the various elements shown in the figures, including any functional blocks labeled as "processors" and/or "controllers," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

As used in this application, the term "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It should be appreciated by those of ordinary skill in the art that any block diagrams herein represent conceptual views of illustrative circuitry embodying the principles of the disclosure.

What is claimed is:

1. An image sensing device comprising:
   a pixel array including imaging pixels and event sensing pixels, the pixel array being a two-dimensional array, the imaging pixels and the event sensing pixels being interspersed in the pixel array;
   imaging pixel circuitry configured to provide image signals from the imaging pixels;
   event sensing pixel circuitry configured to provide an event signal from the event sensing pixels; and
   a trench isolation around each of the imaging pixels and the event sensing pixels in the pixel array, wherein,
   a first transistor in the imaging pixel circuitry and a second transistor in the event sensing pixel circuitry are respectively arranged below the trench isolation in a cross-section view.

2. The image sensing device according to claim 1, wherein
   the event sensing pixels respectively include photodiodes, and the photodiodes are connected in parallel to the event sensing pixel circuitry to provide the event signal.

3. The image sensing device according to claim 2, wherein
   the image sensing pixels respectively include photodiodes, and corresponding different color filters are arranged for individual ones of the image sensing pixels.

4. The image sensing device according to claim 3, wherein the imaging pixel circuitry including transfer transistors respectively arranged for each of the photodiodes of each of the image sensing pixels.

5. An image sensing device comprising:
   a pixel array including imaging pixels and event sensing pixels, the pixel array being a two-dimensional array, the imaging pixels and the event sensing pixels being interspersed in the pixel array;
   imaging pixel circuitry configured to provide image signals from the imaging pixels;

event sensing pixel circuitry configured to provide an event signal from the event sensing pixels; and
a trench isolation around each of the imaging pixels and the event sensing pixels in the pixel array, wherein,
the two-dimensional array extends in a horizontal direction and a vertical direction, and the trench isolation forms a first boundary region that extends in the horizontal direction, and a second boundary region that extends in the vertical direction, and
a first transistor in the imaging pixel circuitry is arranged below the first boundary region in a cross-section view, and a second transistor in the event sensing pixel circuitry is arranged below the second boundary region in the cross-section view.

6. An image sensing device comprising:
a pixel array including imaging pixels and event sensing pixels, the pixel array being a two-dimensional array, the imaging pixels and the event sensing pixels being interspersed in the pixel array;
imaging pixel circuitry configured to provide image signals from the imaging pixels; and
event sensing pixel circuitry configured to provide an event signal from the event sensing pixels, wherein
the pixel array is formed on a first integrated circuit, and wherein a first transistor in the imaging pixel circuitry and a second transistor in the event sensing pixel circuitry are respectively arranged in a same transistor layer of the first integrated circuit.

7. The image sensing device according to claim 6, wherein
the image sensing device comprises a stacked assembly including a first part bonded to a second part, the first part including the first integrated circuit and the second part including a second integrated circuit.

8. The image sensing device according to claim 7, wherein
a third transistor in the event sensing pixel circuitry is arranged in the second integrated circuit.

9. The image sensing device according to claim 8, wherein
a fourth transistor in the image sensing pixel circuitry is arranged in the second integrated circuit.

10. An image sensing device comprising:
a pixel array including imaging pixels and event sensing pixels, the pixel array being a two-dimensional array, the imaging pixels and the event sensing pixels being interspersed in the pixel array;
imaging pixel circuitry configured to provide image signals from the imaging pixels; and
event sensing pixel circuitry configured to provide an event signal from the event sensing pixels, wherein
the event sensing pixels respectively include photodiodes, and the photodiodes are connected in parallel to the event sensing pixel circuitry to provide the event signal
the image sensing pixels respectively include photodiodes, and corresponding different color filters are arranged for individual ones of the image sensing pixels
the imaging pixel circuitry including transfer transistors respectively arranged for each of the photodiodes of each of the image sensing pixels, and
the event signal for the event sensing pixels is connected for readout without switch gate control.

11. The image sensing device according to claim 10, wherein
the image signals are sequentially readout from respective ones of the imaging pixels using the transfer transistors, simultaneous with the event signal readout.

* * * * *